US011411542B2

(12) United States Patent
Tanaka

(10) Patent No.: US 11,411,542 B2
(45) Date of Patent: Aug. 9, 2022

(54) TRANSIMPEDANCE AMPLIFIER CIRCUIT

(71) Applicant: SUMITOMO ELECTRIC INDUSTRIES, LTD., Osaka (JP)

(72) Inventor: Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/935,949

(22) Filed: Jul. 22, 2020

(65) Prior Publication Data

US 2021/0036670 A1    Feb. 4, 2021

(30) Foreign Application Priority Data

Jul. 30, 2019 (JP) .............................. JP2019-140073
Jul. 30, 2019 (JP) .............................. JP2019-140077
Jul. 30, 2019 (JP) .............................. JP2019-140082

(51) Int. Cl.
*H03F 3/08* (2006.01)
*H03F 3/45* (2006.01)

(52) U.S. Cl.
CPC ... *H03F 3/45179* (2013.01); *H03F 2200/129* (2013.01); *H03F 2203/45512* (2013.01); *H03F 2203/45594* (2013.01)

(58) Field of Classification Search
None
See application file for complete search history.

(56) References Cited

U.S. PATENT DOCUMENTS

| 9,774,305 | B1 | 9/2017 | Broekaert |
| 2011/0316622 | A1 | 12/2011 | Hara |
| 2015/0372648 | A1 * | 12/2015 | Sugimoto ............... H03F 1/083 330/2 |
| 2019/0173588 | A1 * | 6/2019 | Ahmed ............... H04B 10/693 |
| 2020/0007087 | A1 | 1/2020 | Sugimoto |

FOREIGN PATENT DOCUMENTS

JP    2012-010107    1/2012

OTHER PUBLICATIONS

Notice of Allowance for U.S. Appl. No. 16/937,060 dated Feb. 11, 2022.
Corrected Notice of Allowance for U.S. Appl. No. 16/937,060 dated Feb. 17, 2022.

* cited by examiner

*Primary Examiner* — Steven J Mottola
(74) *Attorney, Agent, or Firm* — Smith, Gambrell & Russell, LLP.

(57) ABSTRACT

A transimpedance amplifier circuit includes a single-input amplifier that converts a current signal into a voltage signal, a control current circuit that generates a control current based on the voltage signal and a reference voltage signal, and a bypass circuit. The bypass circuit includes a control circuit configured to receive the control current, a feedback current source configured to generate a direct current (DC) bypass current, and a variable resistance circuit configured to generate an alternating current (AC) bypass current. The control circuit includes a first current mirror circuit that varies the DC bypass current via the feedback current source in accordance with the control current, and a second current mirror circuit that varies the AC bypass current via the variable resistance circuit in accordance with the control current and an offset current.

9 Claims, 15 Drawing Sheets

*Fig.8*

| CAPACITANCE COMPONENT | CAPACITANCE VALUE (fF) |
|---|---|
| $C_{gs}$ | 7.1 |
| $C_{gd}$ | 7.1 |
| $C_{ds}$ | 2.6 |
| $C_{gb}$ | 0.6 |
| $C_{db}$ | 0.6 |
| $C_{sb}$ | 0.6 |

TRANSIMPEDANCE AMPLIFIER CIRCUIT

TECHNICAL FIELD

The present disclosure relates to a transimpedance amplifier circuit.

The present application claims priority based on Japanese Patent Application Nos. 2019-140073, 2019-140077, and 2019-140082, which were filed on Jul. 30, 2019, the entire content disclosed in the aforementioned Japanese patent applications being incorporated herein by reference.

BACKGROUND

Conventionally, there is a transimpedance amplifier circuit that converts an optical signal for optical communication into an electric signal (see, for example, Japanese Unexamined Patent Publication No. 2012-10107 and U.S. Pat. No. 9,774,305). When such a transimpedance amplifier circuit is used in, for example, a Passive Optical Network (PON) optical access system, optical signals having various signal intensities can be input to the transimpedance amplifier circuit. The optical signal has a direct current (DC) component as well as an alternating current (AC) component for transmitting information. Thus, the transimpedance amplifier circuit is required to have a function of removing the DC component contained in the electric signal converted from the optical signal, and a function of controlling a gain in order to secure a dynamic range compatible with various signal intensities.

For example, Japanese Unexamined Patent Publication No. 2012-10107 describes an amplifier circuit including an amplifier that converts an input current into an output voltage, a differential amplifier that converts the output voltage into a differential output signal, and a bypass circuit that draws a bypass current from a photocurrent generated by a photodiode. In this amplifier circuit, the bypass circuit draws the bypass current so that an average value of the output voltage and a reference voltage match. U.S. Pat. No. 9,774,305 describes a transimpedance amplifier circuit including a control circuit for controlling removal of a direct current and a control circuit for controlling an amplitude of a differential output voltage.

In the amplifier circuit described in Japanese Unexamined Patent Publication No. 2012-10107, a diode and a current source are connected between an input terminal and a ground potential, and the diode is driven by an emitter follower circuit included in the bypass circuit. Since an output impedance of the emitter follower circuit is low in a wide frequency range, the bypass current may include not only the DC component but also the AC component. Thus, although the DC component is removed from the photocurrent, the AC component is also removed, so that the amplitude of the output voltage is reduced, and the gain of the transimpedance amplifier circuit is reduced. In such a transimpedance amplifier circuit, when a small signal having a small signal intensity and a signal having a medium signal intensity are input as photocurrents, in order to prevent the AC component from being attenuated, it is considered that the diode is turned off. In this case, since the DC component is not removed from the input current of the amplifier, the output voltage becomes larger than the reference voltage, and an input signal of the differential amplifier is biased and modulated toward a high level side of a signal logic. As a result, the differential output signal may be distorted, and a signal quality may be deteriorated.

On the other hand, in the transimpedance amplifier circuit described in U.S. Pat. No. 9,774,305, the removal of the DC component of the input current and the control of the amplitude are controlled by different control circuits. Thus, the circuit scale increases.

The present disclosure will describe a transimpedance amplifier circuit capable of suitably performing control of removal of a DC component and gain control while suppressing the circuit scale.

SUMMARY

A transimpedance amplifier circuit according to one aspect of the present disclosure is a circuit that generates a differential voltage signal in accordance with an input current signal generated by a photodetector. This transimpedance amplifier circuit includes an input terminal that receives an input current signal, a single-input amplifier that converts a current signal into a voltage signal, a differential amplifier circuit that generates a differential voltage signal based on the voltage signal and a reference voltage signal, a control current circuit that generates a control current based on the voltage signal and the reference voltage signal, and a bypass circuit that generates a direct current (DC) bypass current and an alternating current (AC) bypass current based on the control current. The bypass circuit is electrically connected to the input terminal. The bypass circuit includes a control circuit that receives the control current, a feedback current source that generates the DC bypass current, and a variable resistance circuit that generates the AC bypass current. The control circuit includes a first current mirror circuit and a second current mirror circuit. The first current mirror circuit varies the DC bypass current via the feedback current source in accordance with the control current. The second current mirror circuit varies the AC bypass current via the variable resistance circuit in accordance with the control current and an offset current.

BRIEF DESCRIPTION OF THE DRAWINGS

FIG. 8 is a diagram showing an example of a capacitance value of the inter-terminal capacitance shown in FIG. 7;

DETAILED DESCRIPTION

Specific examples of a transimpedance amplifier circuit according to embodiments of the present disclosure will be described hereinafter with reference to the drawings. The present disclosure is not limited to these exemplifications. It is intended that the present invention is defined by the claims and includes all changes within the meaning and range equivalent to the claims.

Figure 1:
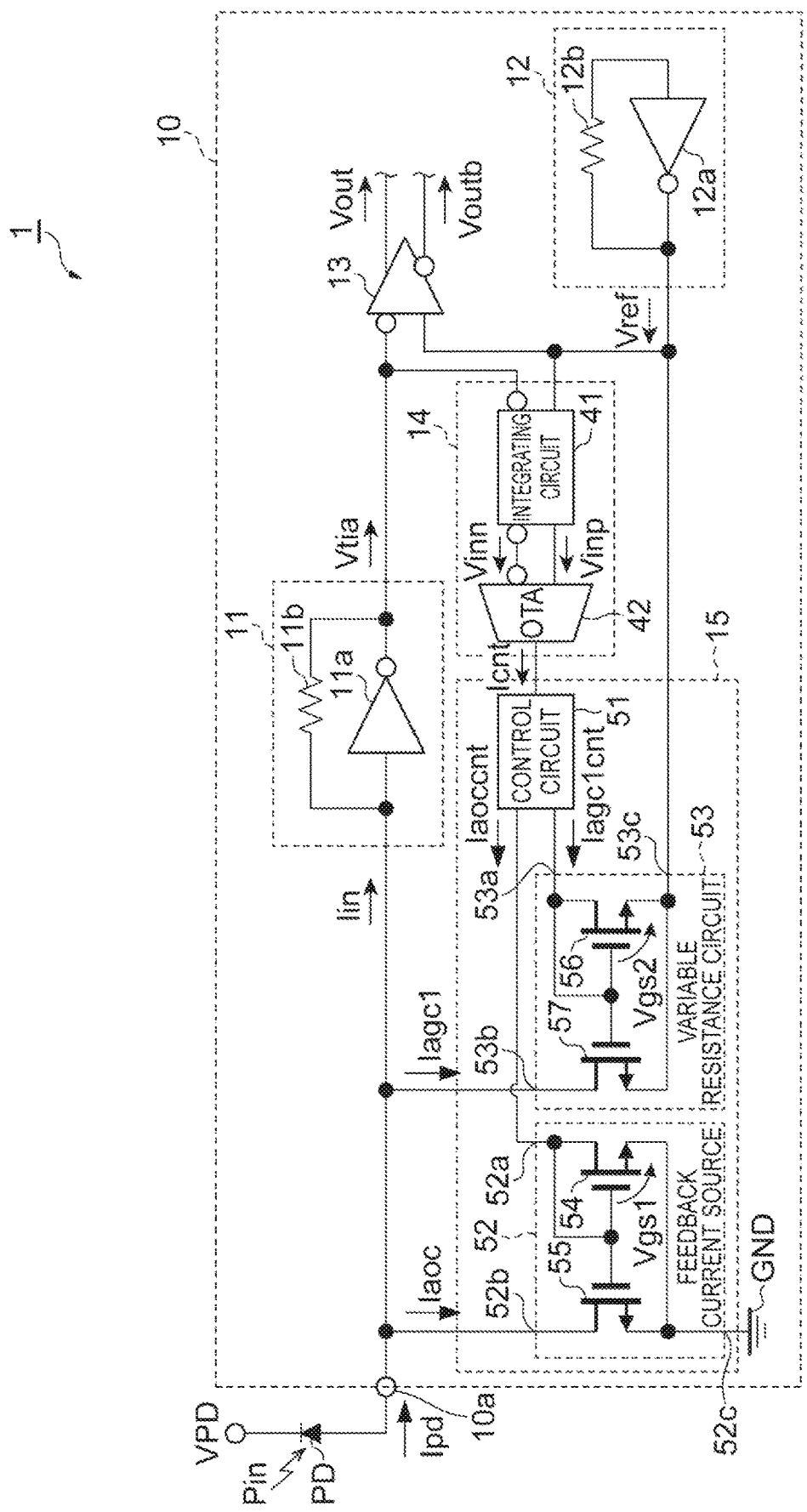
FIG. 1 is a diagram schematically showing a configuration of an optical receiving device including a transimpedance amplifier circuit according to an embodiment.
Figure 2:
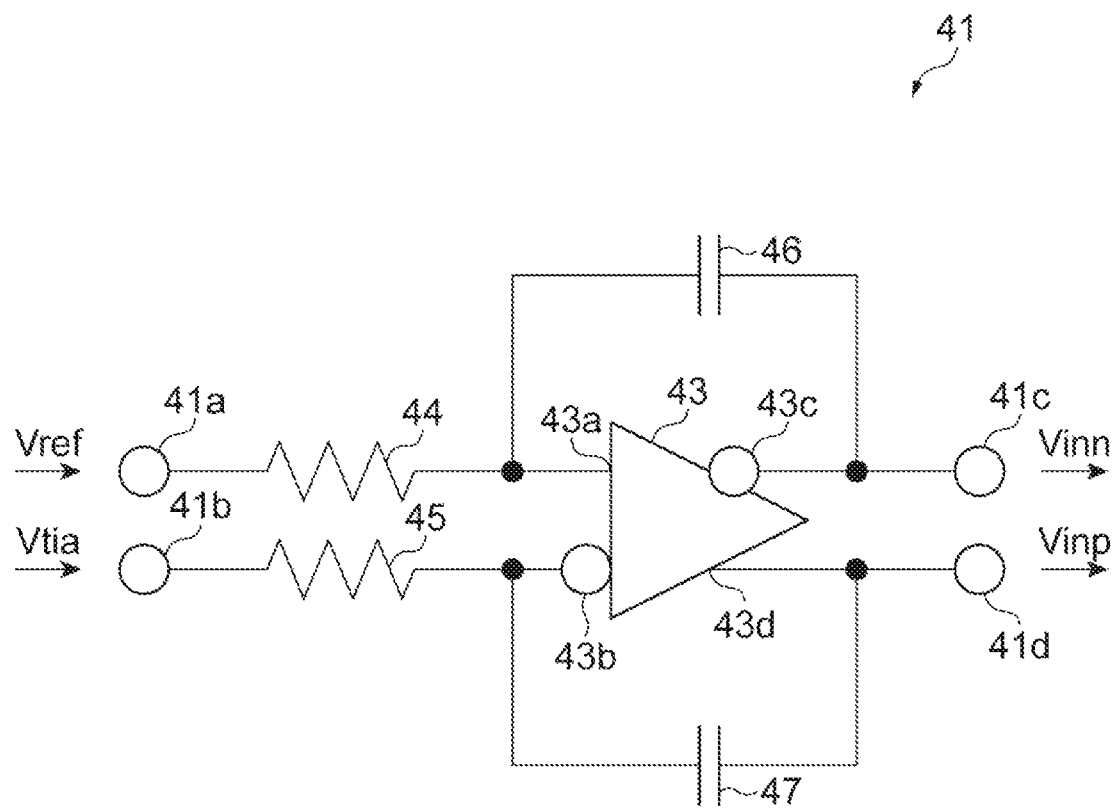
FIG. 2 is a diagram showing a circuit configuration example of an integrating circuit shown in FIG. 1.
Figure 3:
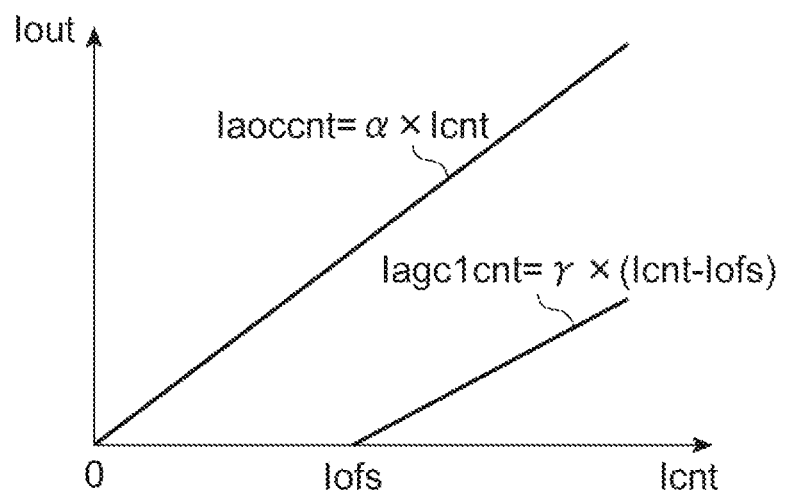
FIG. 3 is a diagram showing a relationship between a control current supplied to a control circuit shown in FIG. 1 and currents generated by the control circuit.
Figure 4:
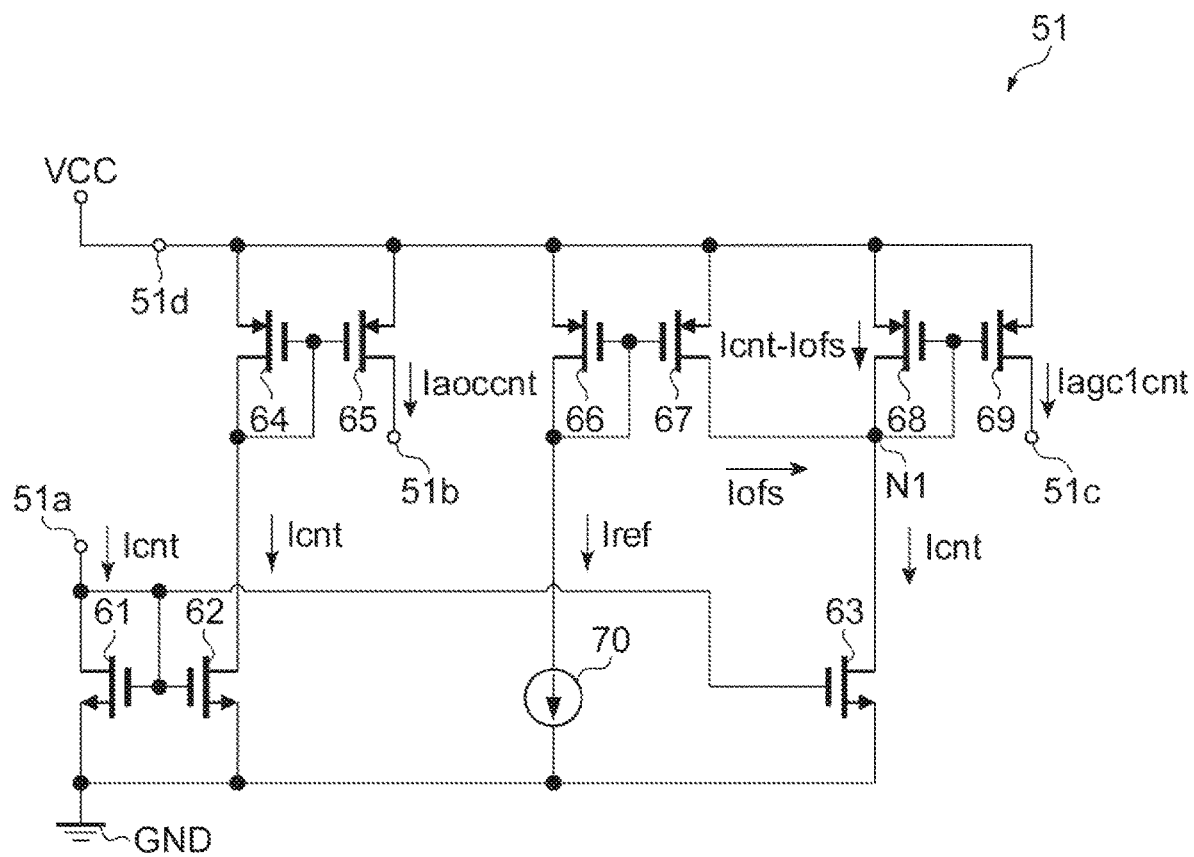
FIG. 4 is a diagram showing a circuit configuration example of the control circuit shown in FIG. 1.

FIG. 1 is a diagram schematically showing a configuration of an optical receiving device including a transimpedance amplifier circuit according to an embodiment. FIG. 2 is a diagram showing a circuit configuration example of an integrating circuit shown in FIG. 1. FIG. 3 is a diagram showing a relationship between a control current supplied to a control circuit shown in FIG. 1 and currents generated by the control circuit. FIG. 4 is a diagram showing a circuit configuration example of the control circuit shown in FIG. 1.

An optical receiving device 1 shown in FIG. 1 receives an optical signal Pin transmitted from an optical transmitting device (not shown). The optical receiving device 1 includes a photodetector PD, and a transimpedance amplifier circuit 10. The photodetector PD receives the optical signal Pin and generates a photocurrent Ipd (input current signal) in response to the optical signal Pin. The photocurrent Ipd may include an alternating current (AC) component corresponding to a modulated signal and a DC component superimposed on the AC component. When a signal intensity (optical power) of the optical signal Pin increases, the AC component and the DC component of the photocurrent Ipd increase. When the signal intensity (optical power) of the optical signal Pin decreases, the AC component and the DC component of the photocurrent Ipd decrease. Examples of the photodetector PD include a photodiode and an avalanche photodiode. One terminal (for example, cathode) of the photodetector PD is electrically connected to a predetermined bias voltage VPD, and the other terminal (for example, anode) of the photodetector PD outputs the photocurrent Ipd. Generally, photodiodes are used with a reverse bias. Here, the term being "electrically connected" means that, for example, a cathode of the photodetector PD is connected to a circuit that generates the bias voltage VPD via wire bonding, and means connection in a state capable of transmitting signals and supplying current and voltage between the two electrically connected to each other. Therefore, the term being "electrically connected" may include direct connection by wiring and indirect connection through another electric element. The term being "electrically connected" is used in the same meaning in the following description.

The transimpedance amplifier circuit 10 receives the photocurrent Ipd generated by the photodetector PD in accordance with the optical signal Pin and generates a differential voltage signal Vout,Voutb, which is a voltage signal, in accordance with the photocurrent Ipd. The differential voltage signal Vout,Voutb includes a pair of complementary signals. The transimpedance amplifier circuit 10 includes, for example, an input terminal 10a. The photocurrent Ipd is input to the input terminal 10a. For example, when the transimpedance amplifier circuit 10 is manufactured as one semiconductor integrated device (for example, a semiconductor chip) by a semiconductor process, the input terminal 10a may be a bonding pad formed on the semiconductor chip. When the semiconductor chip on which the transimpedance amplifier circuit 10 is formed is mounted in a certain package, the input terminal 10a may be an electric terminal provided on an outer surface of the package. For example, as an embodiment, the transimpedance amplifier circuit 10 may be formed on one semiconductor chip or may be mounted in one package or on a substrate.

The transimpedance amplifier circuit 10 includes a transimpedance amplifier (TIA) unit 11 (single-input amplifier), a reference voltage generation circuit 12, a differential amplifier circuit 13, a control current circuit 14, and a bypass circuit 15.

The TIA unit 11 is a circuit that converts a current signal Iin into a voltage signal Vtia. Specifically, the TIA unit 11 includes a voltage amplifier 11a and a feedback resistance element (resistor) 11b. The input terminal and output terminal of the voltage amplifier 11a are electrically connected to each other via the feedback resistance element 11b. That is, the feedback resistance element 11b is electrically connected between the input and output of the voltage amplifier 11a. The current signal Iin is generated by drawing a DC bypass current Iaoc and an AC bypass current Iagc1 (first AC bypass current) from the photocurrent Ipd. The DC bypass current Iaoc and the AC bypass current Iagc1 are controlled by the bypass circuit 15, that will be described in detail later. An increase/decrease of the voltage signal Vtia is inverted with respect to an increase/decrease of the current signal Iin. For example, when a magnitude of the current signal Iin increases, a voltage value of the voltage signal Vtia decreases (lowers). The voltage amplifier 11a is, for example, an inverting amplifier circuit. The TIA unit 11 outputs the voltage signal Vtia to the differential amplifier circuit 13 and the control current circuit 14. A gain (a ratio of an amount of change in the voltage signal Vtia to an amount of change in the current signal Iin) of the TIA unit 11 is determined by a resistance value (transimpedance) of the feedback resistance element 11b. The input impedance of the TIA unit 11 is, for example, about 10 to 100Ω.

The reference voltage generation circuit 12 is a circuit that generates a reference voltage signal Vref that is a DC voltage signal. The reference voltage generation circuit 12 supplies the reference voltage signal Vref to the differential amplifier circuit 13, the control current circuit 14, and the bypass circuit 15. The reference voltage signal Vref has, for example, a predetermined voltage value (fixed value). The reference voltage generation circuit 12 may be configured so that an output impedance of a terminal that supplies the reference voltage signal Vref is a low impedance over a wide band. In the present embodiment, the reference voltage generation circuit 12 is a dummy TIA including, for example, a voltage amplifier 12a (amplifier) and a feedback resistance element (resistor) 12b, and having the same circuit configuration as the TIA unit 11. Specifically, the input terminal and output terminal of the voltage amplifier 12a are electrically connected to each other via the feedback resistance element 12b. That is, the feedback resistance element 12b is electrically connected between the input and output of the voltage amplifier 12a. Since the reference voltage generation circuit 12 has the same circuit configuration as the TIA unit 11, the reference voltage signal Vref can be generated so as to compensate (cancel) the change in the voltage signal Vtia due to a change in the power supply voltage and temperature of the voltage amplifier 11a.

The differential amplifier circuit 13 is a circuit that generates the differential voltage signal Vout,Voutb in accordance with a difference ΔVtia between the voltage signal Vtia and the reference voltage signal Vref. In other words, the differential amplifier circuit 13 uses the reference voltage signal Vref to convert the single (single-phase) voltage signal Vtia into the differential voltage signal Vout,Voutb. The differential amplifier circuit 13 generates the differential voltage signal Vout,Voutb by amplifying the difference ΔVtia. The differential amplifier circuit 13 outputs the differential voltage signal Vout,Voutb to a circuit provided at the next stage (not shown). For example, the differential amplifier circuit 13 is an inverting amplifier and performs inverting amplification. For example, when the voltage value of the voltage signal Vtia is larger than the voltage value of the reference voltage signal Vref, the voltage value of the positive phase component Vout of the differential voltage signal Vout,Voutb becomes smaller than the voltage value of the negative phase component Voutb of the differential voltage signal Vout,Voutb. When the voltage value of the voltage signal Vtia is smaller than the voltage value of the reference voltage signal Vref, the voltage value of the positive phase component Vout of the differential voltage signal Vout,Voutb becomes larger than the voltage value of the negative phase component Voutb of the differential voltage signal Vout,Voutb.

Here, the differential voltage signal Vout,Voutb will be described. The positive phase component Vout (positive phase signal) of the differential voltage signal Vout,Voutb has a phase different from the phase of the negative phase component Voutb (negative phase signal) of the differential voltage signal Vout,Voutb by 180°. For example, the negative phase signal Voutb decreases when the positive phase signal Vout increases, and the negative phase signal Voutb increases when the positive phase signal Vout decreases. When the positive phase signal Vout reaches a maximum value (peak value), the negative phase signal Voutb reaches a minimum value (bottom value). When the positive phase signal Vout reaches the bottom value, the negative phase signal Voutb reaches the peak value. The positive phase signal Vout and the negative phase signal Voutb may have the same amplitude and the same time-average value. A difference between the time-average value of the positive phase component voltage of the differential voltage signal and the time-average value of the negative phase component voltage of the differential voltage signal is referred to as the DC offset. For example, a difference between the time-average value of the voltage of the positive phase signal Vout and the time-average value of the voltage of the negative phase signal Voutb is the DC offset. In the following description, the simple term "DC offset" will refer to the difference between the time-average value of the voltage of the positive phase signal Vout and the time-average value of the voltage of the negative phase signal Voutb. The DC offset is preferably small in signal transmission.

The control current circuit 14 is a circuit that generates the control current Icnt based on an integrated value of the difference ΔVtia between the voltage signal Vtia and the reference voltage signal Vref. The difference ΔVtia is a signal (voltage value) obtained by subtracting the voltage signal Vtia from the reference voltage signal Vref. The control current circuit 14 includes an integrating circuit 41 and an operational transconductance amplifier (OTA) 42.

The integrating circuit 41 is a circuit that integrates the difference ΔVtia to generate a differential integral signal (voltage signal Vinp and voltage signal Vinn). As shown in FIG. 2, the integrating circuit 41 has input terminals 41a and 41b and output terminals 41c and 41d. The input terminal 41a is electrically connected to the output terminal of the reference voltage generation circuit 12 (voltage amplifier 12a), and the reference voltage signal Vref is input to the input terminal 41a. The input terminal 41b is electrically connected to the output terminal of the TIA unit 11 (voltage amplifier 11a), and the voltage signal Vtia is input to the input terminal 41b. The output terminal 41c is electrically connected to an inverting input terminal of an OTA 42, and outputs the voltage signal Vinn that is the negative phase component of the differential integral signal to the OTA 42. The output terminal 41d is electrically connected to a non-inverting input terminal of the OTA 42, and outputs the voltage signal Vinp that is the positive phase component of the differential integral signal to the OTA 42. For example, when the voltage value of the voltage signal Vtia is larger than the voltage value of the reference voltage signal Vref, the voltage value of the voltage signal Vinp becomes smaller than the voltage value of the voltage signal Vinn.

The integrating circuit 41 includes an operational amplifier 43, resistance elements (resistors) 44 and 45, and capacitors 46 and 47. The operational amplifier 43 has a non-inverting input terminal 43a, an inverting input terminal 43b, an inverting output terminal 43c, and a non-inverting output terminal 43d. The non-inverting input terminal 43a is electrically connected to the input terminal 41a via the resistance element 44. The inverting input terminal 43b is electrically connected to the input terminal 41b via the resistance element 45. The inverting output terminal 43c is electrically connected to the output terminal 41c and is also electrically connected to the non-inverting input terminal 43a via the capacitor 46. That is, the capacitor 46 is connected so as to apply negative feedback from the inverting output terminal 43c to the non-inverting input terminal 43a. The non-inverting output terminal 43d is electrically connected to the output terminal 41d and is also electrically connected to the inverting input terminal 43b via the capacitor 47. That is, the capacitor 47 is connected so as to apply negative feedback from the non-inverting output terminal 43d to the inverting input terminal 43b. Regarding a change in output with respect to a change in input, for example, when the voltage value of the voltage signal Vtia is larger than the voltage value of the reference voltage signal Vref, the voltage value of the voltage signal Vinp becomes smaller than the voltage value of the voltage signal Vinn.

Here, it is assumed that the gain of the operational amplifier 43 is, for example, 1000 times or more, a resistance value R1 of the resistance element 44 and a resistance value R2 of the resistance element 45 are equal to each other, and a capacitance value C1 of the capacitor 46 and a capacitance value C2 of the capacitor 47 are equal to each other. In this case, the gain of the operational amplifier 43 is considered to be infinite, and the integrating circuit 41 operates as an integrator having a time constant $R1 \times C1$.

The OTA 42 is a circuit that converts the differential integral signal (voltage signal Vinp and voltage signal Vinn) into the control current Icnt that is a single current signal (error current). The OTA 42 has a known circuit configuration, for example, a configuration in which a current mirror circuit is added to the differential amplifier circuit. The OTA 42 has a transconductance corresponding to a gain, and an input/output impedance of the OTA 42 is, for example, several hundreds of KΩ or more. A control current Icnt is obtained by multiplying an input differential voltage that is a difference between a voltage signal Vinp and a voltage signal Vinn input to the OTA 42 by the transconductance. The difference between the voltage signal Vinp and the voltage signal Vinn changes depending on an integrated value of the difference ΔVtia. The OTA 42 outputs the control current Icnt to a bypass circuit 15.

The bypass circuit 15 is a circuit that generates the DC bypass current Iaoc and the AC bypass current Iagc1 based on the control current Icnt. The bypass circuit 15 includes, for example, a control circuit 51, a feedback current source 52, and a variable resistance circuit 53 (first variable resistance circuit).

The control current Icnt is input to the control circuit 51. The control circuit 51 controls the feedback current source 52 so that the DC bypass current Iaoc increases as the control current Icnt increases. When the control current Icnt exceeds a current value of an offset current Iofs, the control circuit 51 controls the variable resistance circuit 53 so that the AC bypass current Iagc1 increases as the control current Icnt increases. The current value of the offset current Iofs is a predetermined current value (fixed value). Specifically, the control circuit 51 receives the control current Icnt from the control current circuit 14 (OTA 42), and generates a control current Iaoccnt (first control current) and a control current Iagc1cnt (second control current) in accordance with the control current Icnt. The control circuit 51 outputs the control current Iaoccnt to the feedback current source 52, and controls the feedback current source 52 by the control current Iaoccnt. The control circuit 51 outputs the control current Iagc1cnt to the variable resistance circuit 53, and controls the variable resistance circuit 53 by the control current Iagc1cnt.

As shown in FIG. 3, the current value of the control current Iaoccnt is proportional to the current value of the control current Icnt. The current value of the control current Iaoccnt is α times the current value of the control current Icnt (Iaoccnt=α×Icnt). An amplification factor α is a real number larger than 1, for example. The control circuit 51 generates the control current Iaoccnt by, for example, amplifying the control current Icnt with the amplification factor α (first amplification factor). The current value of the control current Iagc1cnt is proportional to the current value of the control current Icnt when the current value of the control current Icnt is larger than the current value of the offset current Iofs. In other words, the current value of the control current Iagc1cnt is γ times the current value obtained by subtracting the current value of the offset current Iofs from the control current Icnt (Iagc1cnt=γ×(Icnt−Iofs)). An amplification factor γ is a real number larger than 1, for example. The control circuit 51, for example, generates the offset current Iofs having a predetermined current value (offset current value), and generates the control current Iagc1cnt by amplifying a difference (difference current) between the current (in this case, the control current Icnt), generated by amplifying the control current Icnt, and the offset current Iofs with the amplification factor γ (second amplification factor). Thus, the amplification factor α is adjusted for generating the control current Iaoccnt. An offset current value for determining a current for starting automatic gain control (AGC) and the amplification factor γ for determining a control sensitivity of the AGC are adjusted for generating the control current Iagc1cnt.

The control circuit 51 shown in FIG. 4 has a circuit configuration for realizing the control current Iaoccnt and the control current Iagc1cnt shown in FIG. 3. As shown in FIG. 4, the control circuit 51 has, for example, the input terminal 51a, output terminals 51b and 51c, and a power supply terminal 51d. The input terminal 51a is electrically connected to the output terminal of the control current circuit 14 (OTA 42), and the control current Icnt is input to the input terminal 51a. The output terminal 51b is electrically connected to the input terminal 52a of the feedback current source 52, and supplies the control current Iaoccnt to the feedback current source 52. The output terminal 51c is electrically connected to the control terminal 53a of the variable resistance circuit 53, and supplies the control current Iagc1cnt to the variable resistance circuit 53. The power supply terminal 51d is electrically connected to a power supply wiring that supplies the power supply voltage VCC, and the power supply voltage VCC is supplied to the power supply terminal 51d.

The control circuit 51 includes transistors 61 to 69 and a current source 70. The transistors 61 and 69 are, for example, field effect transistors (FETs) having a Metal-Oxide-Semiconductor (MOS) structure. In the example shown in FIG. 4, the transistors 61 to 63 are N-channel MOS (NMOS) transistors, and the transistors 64 to 69 are P-channel MOS (PMOS) transistors.

The transistors 61 to 63 constitute a current mirror circuit. Specifically, the transistor 61 functions as an input transistor of the current mirror circuit, and the transistors 62 and 63 function as output transistors of the current mirror circuit. Sources of the transistors 61 to 63 are electrically connected to the ground potential GND. A gate and a drain of the transistor 61 are electrically connected to each other and further electrically connected to the input terminal 51a. A gate of each of the transistors 62 and 63 is electrically connected to the gate and drain of the transistor 61. A drain of the transistor 62 is electrically connected to a drain and a gate of the transistor 64. A drain of the transistor 63 is electrically connected to a drain and a gate of the transistor 68 via a node N1.

Since the transistors 61 and 62 and the transistors 61 and 63 each constitute a current mirror circuit, for example, an output current (drain current) having a magnitude proportional to the magnitude of the drain current (control current Icnt) of the transistor 61 is output from each drain of the transistors 62 and 63. That is, when the input current (control current Icnt) is input to the input transistor (transistor 61), an output current having a magnitude proportional to the magnitude of the input current (control current Icnt) is output from the output transistor (transistors 62 and 63). Here, for convenience of explanation, the current mirror ratio is assumed to be input current:output current of transistor 62: output current of transistor 63=1:1:1. Thus, the control current Icnt input to the input terminal 51a is duplicated by the transistors 61 to 63, and the control current Icnt is output from each drain of the transistors 62 and 63. The duplicated two control currents Icnt flow from each drain of the transistors 62 and 63 toward each source of the transistors 62 and 63. In order to realize the above-described current mirror ratio, the transistors 61 to 63 may have the same electrical characteristics. The current mirror ratio may be appropriately changed according to a relationship between the control currents Iaocent and Iagc1cnt and the control current Icnt by, for example, making the sizes of the transistors 62 and 63 different from the size of the transistor 61.

The transistors 64 and 65 constitute a current mirror circuit. The transistor 64 functions as an input transistor of the current mirror circuit, and the transistor 65 functions as an output transistor of the current mirror circuit. Sources of the transistors 64 and 65 are electrically connected to the power supply terminal 51d via power supply wiring. The gate and drain of the transistor 64 are electrically connected to each other and further electrically connected to the drain of the transistor 62. A gate of the transistor 65 is electrically connected to the gate and drain of the transistor 64. A drain of the transistor 65 is electrically connected to the output terminal 51b.

The control current Icnt output from the drain of the transistor 62 is input to the drain of the transistor 64, and an output current (drain current) having a magnitude proportional to the magnitude of the drain current (control current Icnt) of the transistor 64 is output as the control current Iaocent from the drain of the transistor 65. That is, when the input current (control current Icnt) is input to the input transistor (transistor 64), an output current having a magnitude proportional to the magnitude of the input current (control current Icnt) is output from the output transistor (transistor 65). The actual input current flows from the source of the transistor 64 toward the drain of the transistor 64, and further flows into the drain of the transistor 62. With this configuration, the output current of the transistor 62 is equal to the input current of the transistor 64. In this case, the current mirror ratio of the current mirror circuit constituted by the transistors 64 and 65 is set to 1:α. That is, the control current Iaocent is a current (α×Icnt) having a magnitude obtained by amplifying the control current Icnt by a times. The control current Iaocent flows from the drain of the transistor 65 toward the output terminal 51b.

The transistors 66 and 67 constitute a current mirror circuit. The transistor 66 functions as an input transistor of the current mirror circuit, and the transistor 67 functions as an output transistor of the current mirror circuit. Sources of the transistors 66 and 67 are electrically connected to the power supply terminal 51d via power supply wiring. A gate and a drain of the transistor 66 are electrically connected to each other and further electrically connected to the current source 70. A gate of the transistor 67 is electrically connected to the gate and drain of the transistor 66. A drain of the transistor 67 is electrically connected to the drain and gate of the transistor 68 via the node N1.

The reference current Iref supplied from the current source 70 is input to the drain of the transistor 66, and an output current (drain current) having a magnitude proportional to the magnitude of the drain current (reference current Iref) of the transistor 66 is output as the offset current Iofs from the drain of the transistor 67. In this case, the current mirror ratio of the current mirror circuit constituted by the transistors 66 and 67 is set to 1:m. That is, the offset current Iofs is a current (m×Iref) having a magnitude obtained by amplifying the reference current Iref by m times. That is, when the input current (reference current Iref) is input to the input transistor 66, the output transistor 67 outputs an output current (reference current amplified m times). The offset current Iofs flows from the drain of the transistor 67 toward the node N1. The value of m is, for example, a real number larger than 1, and is arbitrarily selected according to the optical power at which the AGC is desired to be operated. Since the current value of the reference current Iref is a fixed value, the current value of the offset current Iofs (offset current value) is also a fixed value.

The transistors 68 and 69 constitute a current mirror circuit. The transistor 68 functions as an input transistor of the current mirror circuit, and the transistor 69 functions as an output transistor of the current mirror circuit. Sources of the transistors 68 and 69 are electrically connected to the power supply terminal 51d via power supply wiring. The gate and drain of the transistor 68 are electrically connected to each other, and further electrically connected to the drain of the transistor 63 and the drain of the transistor 67 via the node N1. A gate of the transistor 69 is electrically connected to the gate and drain of the transistor 68. A drain of the transistor 69 is electrically connected to the output terminal 51c.

The control current Icnt output from the drain of the transistor 63 is combined with the offset current Iofs output from the drain of the transistor 67 at the node N1. Specifically, the offset current Iofs is subtracted from the control current Icnt. At this time, a difference current (Icnt−Iofs) flows to the drain of the transistor 68 only when the current value of the control current Icnt is larger than the current value of the offset current Iofs, and the output current (drain current) having a magnitude proportional to the magnitude of the drain current (difference current) of the transistor 68 is output as the control current Iagc1cnt from the drain of the transistor 69. In this case, the current mirror ratio of the current mirror circuit constituted by the transistors 68 and 69 is set to 1:γ. That is, the control current Iagc1cnt is a current (γ×(Icnt−Iofs)) having a magnitude obtained by amplifying the difference current (Icnt−Iofs) by γ times. That is, when the input current (difference current (Icnt−Iofs)) is input to the input transistor 68, the output transistor 69 outputs the output current (difference current amplified by γ times). The control current Iagc1cnt flows from the drain of the transistor 69 toward the output terminal 51c.

On the other hand, when the current value of the control current Icnt is smaller than the current value of the offset current Iofs, no current flows to the transistor 68, so that the potential of the node N1 is pulled up with high resistance on the power supply voltage VCC side by the transistor 68 diode-connected. Since a drain-source voltage of the transistor 67 decreases, the transistors 66 and 67 do not operate as a current mirror circuit. At this time, the transistor 67 operates in a triode region (linear region), so that the potential of the node N1 is pulled up with low resistance on the power supply voltage VCC side. The triode region is, for example, a state in which a voltage value obtained by subtracting a threshold voltage from a gate-source voltage of the transistor is larger than the drain-source voltage.

Since the gate-source voltage is not applied to the transistor 68, a resistance value of the transistor 67 to which the gate-source voltage is applied is smaller than a resistance value of the transistor 68. As described above, the transistor 67 operates in the triode region, so that the transistor 67 cannot supply the offset current Iofs, and at the same time, the control current Icnt from the transistor 63 entirely flows through the transistor 67. As a result, the control current Iagc1cnt is output from the output terminal 51c only when the current value of the control current Icnt is larger than the current value of the offset current Iofs (in the region of Icnt−Iofs>0). For example, when the current value of the control current Icnt is smaller than the offset current Iofs, the gate-source voltage of the transistor 69 that is PMOS is almost 0 V, and the drain current (output current) of the transistor 69 is 0.

Although the input/output characteristic of FIG. 3 can be obtained by the control circuit 51 shown in FIG. 4, the above-described current mirror ratio can be appropriately changed. As the circuit configuration of the control circuit 51, another circuit configuration capable of obtaining the input/output characteristic of FIG. 3 may be adopted.

The feedback current source 52 is a current source for constituting an auto-offset control (AOC) circuit. The feedback current source 52 is a circuit that generates the DC bypass current Iaoc based on the control current Icnt. More specifically, the feedback current source 52 generates the DC bypass current Iaoc in accordance with the control current Iaoccnt. The feedback current source 52 has, for example, an input terminal 52a, an output terminal 52b, and a ground terminal 52c. The input terminal 52a is electrically connected to the output terminal 51b of the control circuit 51 and receives the control current Iaoccnt from the control circuit 51. The output terminal 52b is electrically connected to the input terminal 10a and outputs the DC bypass current Iaoc (specifically, draws the DC bypass current Iaoc into the feedback current source 52). The ground terminal 52c is electrically connected to the ground potential GND. The feedback current source 52 includes a field effect transistor 54 (first field effect transistor) and a field effect transistor 55 (second field effect transistor).

Each of the field effect transistors 54 and 55 is, for example, an N-channel MOS transistor. The size of the field effect transistor 54 and the size of the field effect transistor 55 may be the same as or different from each other. Sources (first source and second source) of the field effect transistors 54 and 55 are electrically connected to each other and also electrically connected to the ground potential GND via the ground terminal 52c. A drain (first drain) of the field effect transistor 54 is electrically connected to the output terminal 51b of the control circuit 51 via the input terminal 52a and receives the control current Iaoccnt from the control circuit 51. A gate (first gate) of the field effect transistor 54 is electrically connected to the drain of the field effect transistor 54. A drain (second drain) of the field effect transistor 55 is electrically connected to the input terminal 10a via the output terminal 52b. A gate (second gate) of the field effect transistor 55 is electrically connected to the drain and gate of the field effect transistor 54.

In the feedback current source 52 configured as above, the control current Iaoccnt flowing from the input terminal 52a flows to the field effect transistor 54 diode-connected, so that a gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that a gate-source voltage of the field effect transistor 55 is equal to the gate-source voltage Vgs1. Since the source of the field effect transistor 55 is electrically connected to the ground potential GND, the source potential is about 0 V. On the other hand, an input potential (for example, about 0.5 to 2 V) of the TIA unit 11 is applied to the drain of the field effect transistor 55. Accordingly, the field effect transistor 55 operates in the saturation region of the drain current-voltage characteristics. The saturation region is a state in which the voltage value obtained by subtracting the threshold voltage from the gate-source voltage of the transistor is smaller than the drain-source voltage. Even if the drain voltage of the field effect transistor 55 increases in the saturation region, a degree to which the drain current increases with respect to the increase of the drain voltage decreases as compared to the linear region. Accordingly, an impedance (output impedance) of the output terminal 52b has a relatively large value. For example, by setting the impedance value of the output terminal 52b to be larger than the input impedance value of the TIA unit 11, it is possible to prevent the AC component of the photocurrent Ipd from flowing into the feedback current source 52 while the DC bypass current Iaoc being drawn into the feedback current source 52.

That is, the field effect transistors 54 and 55 constitute a current mirror circuit. The control current Iaoccnt serves as an input current, and the DC bypass current Iaoc proportional to the control current Iaoccnt is output as an output current. In other words, the feedback current source 52 flows the DC bypass current Iaoc from the drain of the field effect transistor 55 to the source of the field effect transistor 55 in accordance with the control current Iaoccnt. As a result, the DC bypass current Iaoc is drawn from the photocurrent Ipd. As a result, the DC component and a low frequency component are removed from the difference ΔVtia, and a potential (average potential) of the voltage signal Vtia is aligned with a potential of the reference voltage signal Vref (DC offset control). Consequently, the difference between the time-average value of the voltage of the positive phase signal Vout and the time-average value of the voltage of the negative phase signal Voutb is reduced.

The variable resistance circuit 53 is a circuit that generates the AC bypass current Iagc1 based on the control current Icnt. More specifically, the variable resistance circuit 53 generates the AC bypass current Iagc1 in accordance with the control current Iagc1cnt. The variable resistance circuit 53 has, for example, a control terminal 53a, a resistance terminal 53b, and a resistance terminal 53c. The control terminal 53a is electrically connected to the output terminal 51c of the control circuit 51 and receives the control current Iagc1cnt from the control circuit 51. The resistance terminal 53b is electrically connected to the input terminal 10a. The resistance terminal 53c is electrically connected to an output terminal of the reference voltage generation circuit 12 (voltage amplifier 12a) and receives the reference voltage signal Vref from the reference voltage generation circuit 12. The variable resistance circuit 53 includes a field effect transistor 56 (third field effect transistor) and a field effect transistor 57 (fourth field effect transistor).

Each of the field effect transistors 56 and 57 is, for example, an N-channel MOS transistor. The size of the field effect transistor 56 and the size of the field effect transistor 57 may be the same as or different from each other. Sources (third source and fourth source) of the field effect transistors 56 and 57 are electrically connected to each other and also electrically connected to the output terminal of the reference voltage generation circuit 12 (voltage amplifier 12a) via the resistance terminal 53c. The reference voltage signal Vref is input (supplied) to the sources of the field effect transistors 56 and 57. A drain (third drain) of the field effect transistor 56 is electrically connected to the output terminal 51c of the control circuit 51 via the control terminal 53a and receives the control current Iagc1cnt from the control circuit 51. A gate (third gate) of the field effect transistor 56 is electrically connected to the drain of the field effect transistor 56. A drain (fourth drain) of the field effect transistor 57 is electrically connected to the input terminal 10a via the resistance terminal 53b. A gate (fourth gate) of the field effect transistor 57 is electrically connected to the drain and gate of the field effect transistor 56.

In the variable resistance circuit 53 configured as above, the control current Iagc1cnt flowing from the control terminal 53a flows to the field effect transistor 56 diode-connected, so that a gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other, so that a gate-source voltage of the field effect transistor 57 is equal to the gate-source voltage Vgs2. The reference voltage signal Vref is supplied to the source of the field effect transistor 57, and the input potential of the TIA unit 11 is applied to the drain of the field effect transistor 57. Since the reference voltage signal Vref has substantially the same potential as the input potential of the TIA unit 11, the field effect transistor 57 operates in a deep triode region (linear region). The deep triode region is a state in which the voltage value obtained by subtracting the threshold voltage from the gate-source voltage of the transistor is much larger than the drain-source voltage. When the drain voltage of the field effect transistor 57 increases in the linear region, the drain current increases accordingly. Especially when the drain voltage is relatively small, the drain current can be considered changed (linearly) in proportion to the drain voltage. A ratio of the drain voltage to the drain current of the field effect transistor 57 will be expressed as the resistance value $R_{AGC1}$. The resistance value $R_{AGC1}$ will be described later.

A drain current Id (that is, the AC bypass current Iagc1) of the field effect transistor 57 biased in the triode region can be represented by Formula (1) by using an intrinsic gain (gain coefficient) β of the field effect transistor 57 and a threshold voltage Vth of the field effect transistor 57. The intrinsic gain β is a value depending on the semiconductor process and size of the field effect transistor 57.

[Formula 1]

$$Iagc1 = Id = \frac{\beta}{2} \times \{2 \times (Vgs2 - Vth) \times Vds - Vds^2\} \quad (1)$$

In the triode region, when a potential difference between the drain and the source is small, a magnitude relationship between the drain potential and the source potential may be reversed. In this case, a terminal having the lowest voltage with respect to the gate functions as the source. Since a circuit symbol of the transistor is used for convenience in expressing a circuit, a terminal notation of the transistor in the circuit diagram may not match the actual operation of the transistor. In this case, the terminals are appropriately replaced so that the drain-source voltage Vds is 0 or more, and the terminal having a low potential is always regarded as the source.

As shown in Formula (2), the gate-source voltage Vgs2 is expressed by adding the drain-source voltage Vds to the gate-source voltage Vgs0. The gate-source voltage Vgs0 is the gate-source voltage when the drain-source voltage Vds is 0 V.

[Formula 2]

$$Vgs2 = Vgs0 + Vds \quad (2)$$

Formula (3) is obtained by substituting Formula (2) into Formula (1). As shown in Formula (3), the drain current Id (AC bypass current Iagc1) is proportional to a square of the drain-source voltage Vds, and thus includes a non-linear component.

[Formula 3]

$$Iagc1 = Id = \frac{\beta}{2} \times \{2 \times (Vgs0 + Vds - Vth) \times Vds - Vds^2\} = \beta \times Vds \times \left\{(Vgs0 - Vth) + \frac{Vds}{2}\right\} \quad (3)$$

As shown in Formula (4), a differential resistance value Rd (resistance value $R_{AGC1}$) is obtained by differentiating Formula (3) by the drain-source voltage Vds and calculating a reciprocal of the calculation result. As shown in Formula (4), the resistance value $R_{AGC1}$ changes according to the drain-source voltage Vds. That is, the resistance value $R_{AGC1}$ decreases as the gate-source voltage Vgs2 (=Vgs0+Vds) increases. Since the drain potential is modulated according to the photocurrent Ipd, the resistance value $R_{AGC1}$ varies non-linearly.

[Formula 4]

$$R_{AGC1} = Rd = \frac{1}{\frac{\partial Id}{\partial Vds}} = \frac{1}{\beta \times (Vgs0 - Vth + Vds)} \quad (4)$$

As shown in Formula (5), a transconductance gm in the triode region is obtained by differentiating Formula (3) by the gate-source voltage Vgs0. In the triode region, the drain-source voltage Vds is smaller than a voltage obtained by subtracting the threshold voltage Vth from the gate-source voltage Vgs2. In particular, in the deep triode region, the drain-source voltage Vds is much smaller than the voltage obtained by subtracting the threshold voltage Vth from the gate-source voltage Vgs2, so that the transconductance gm in the triode region becomes negligibly small as compared with a transconductance (β×(Vgs−Vth)) in saturation operation.

[Formula 5]

$$gm = \frac{\partial Id}{\partial Vgs0} = \beta \times Vds \quad (5)$$

That is, although the variable resistance circuit 53 has the same circuit configuration as the feedback current source 52, the variable resistance circuit 53 does not operate as a current mirror circuit, and the field effect transistor 57 operates as a variable resistor controlled by the gate-source voltage Vgs2. That is, the reference voltage generation circuit 12 grounds the field effect transistor 57 in an alternating current manner and the field effect transistor 57 is biased in the deep triode region. Since a potential of the resistance terminal 53b and a potential of the resistance terminal 53c are substantially the same, the DC component of the photocurrent Ipd hardly flows to the variable resistance circuit 53, and the AC component of the photocurrent Ipd partially flows as the AC bypass current Iagc1 into the variable resistance circuit 53 (field effect transistor 57). In other words, the variable resistance circuit 53 flows the AC bypass current Iagc1 between the drain and source of the field effect transistor 57 in accordance with the control current Iagc1cnt. Since the AC bypass current Iagc1 is an AC component, the AC bypass current Iagc1 may flow from the drain of the field effect transistor 57 to the source of the field effect transistor 57 according to the photocurrent Ipd or may flow from the source of the field effect transistor 57 to the drain of the field effect transistor 57 according to the photocurrent Ipd. The AC bypass current Iagc1 is also determined depending on the magnitude of the resistance value $R_{AGC1}$ of the field effect transistor 57 with respect to the magnitude of the input impedance of the TIA unit 11. When the resistance value $R_{AGC1}$ of the field effect transistor 57 is made smaller than the input impedance of the TIA unit 11, the AC bypass current Iagc1 increases. At this time, the DC component of the photocurrent Ipd can be prevented from flowing into the variable resistance circuit 53 by suppressing the drain-source voltage Vds of the field effect transistor 57 to be small.

That is, the photocurrent Ipd increases, the difference ΔVtia increases, and when the control current Icnt exceeds the current value of the offset current Iofs, the control current Iagc1cnt is supplied to the variable resistance circuit 53. As a result, the gate-source voltage Vgs2 is generated in the field effect transistors 56 and 57. As the gate-source voltage Vgs2 increases, the resistance value $R_{AGC1}$ of the field effect transistor 57 decreases, so that the signal component (AC component) of the photocurrent Ipd excluding the DC component is partially drawn as the AC bypass current Iagc1 from the photocurrent Ipd. As a result, a possibility that the TIA unit 11 will be saturated by a large signal input is reduced. More specifically, when the gain (transimpedance) of the TIA unit 11 is set to a substantially constant value, the photocurrent Ipd increases, and when the amplitude of the current signal Iin increases to a predetermined value or more, an amplitude of the voltage signal Vtia is saturated. Thus, gain control is performed such that saturation of the amplitude of the voltage signal Vtia is suppressed by drawing the AC bypass current Iagc1 from the photocurrent Ipd. When the intensity of the optical signal Pin changes, the AGC automatically adjusts the magnitude of the AC bypass current Iagc1 according to the magnitude of the voltage signal Vtia (actually, the magnitude of the difference ΔVtia between the voltage signal Vtia and the reference voltage signal Vref). Although the AGC adjusts the magnitude of the signal component (AC component) of the current signal Iin, it is preferable that the DC component of the current signal Iin and control (DC offset control) of the DC component be not affected at that time.

As described above, a current proportional to the drain-source voltage flows between the drain and source of the field effect transistor 57 biased in the deep triode region (linear region). Since the reference voltage signal Vref has substantially the same potential as the input potential of the TIA unit 11, no DC current flows, and the AC bypass current Iagc1 does not disturb the DC offset control. The change in the resistance value $R_{AGC1}$ of the field effect transistor 57 does not affect the AOC control and may affect only the gain control.

Figure 5:
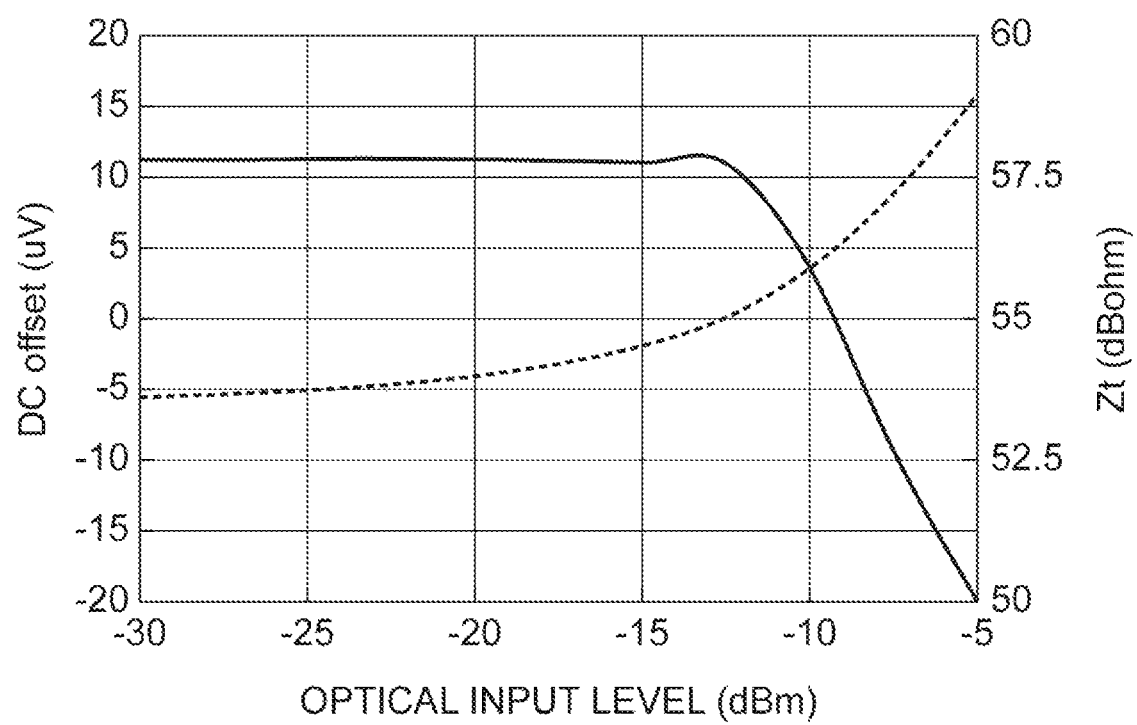
FIG. 5 is a diagram showing direct current (DC) offset characteristics and gain characteristics in the transimpedance amplifier circuit shown in FIG. 1.

Next, the function and effect of the transimpedance amplifier circuit 10 will be described. FIG. 5 is a diagram showing DC offset characteristics and gain characteristics in the transimpedance amplifier circuit shown in FIG. 1. The horizontal axis of FIG. 5 represents an optical input level (unit: dBm) of the optical signal Pin. The vertical axis of FIG. 5 represents a DC offset amount (unit: μV) and a transimpedance gain Zt (unit: dBohm). The broken line shown in FIG. 5 indicates the DC offset characteristics. The DC offset characteristics show dependency of the DC offset amount on the optical input level of the optical signal Pin. The solid line in FIG. 5 indicates the gain characteristics. The gain characteristics show dependency of the transimpedance gain Zt of the transimpedance amplifier circuit 10 on the optical input level of the optical signal Pin.

As described above, when the current is drawn from the photocurrent Ipd, the transimpedance amplifier circuit 10 can control the DC component (DC bypass current Iaoc) and the AC component (AC bypass current Iagc1) independently. Thus, for small signals of −30 dBm to −15 dBm, it is not necessary to draw the AC component from the photocurrent Ipd. Therefore, in the small signal, only the DC bypass current Iaoc is drawn from the photocurrent Ipd, so that only the DC offset is controlled.

When the optical input level of the signal exceeds −15 dBm, the control current Iagc1cnt starts to flow in the variable resistance circuit 53, and the resistance value $R_{AGC1}$ of the field effect transistor 57 decreases. As a result, the AC bypass current Iagc1 is drawn from the photocurrent Ipd, and the transimpedance gain Zt of the transimpedance amplifier circuit 10 starts to decrease. As the transimpedance gain Zt decreases, the loop transfer gain of the control loop decreases, so that an amount of DC offset suppression decreases slightly. However, since the amount of suppression is approximately the amount expressed in the unit of μV, an amount of DC offset variation is negligibly small with respect to signal amplitude. Therefore, in a wide range of the optical input level, distortion due to saturation of the transimpedance amplifier circuit 10 is suppressed, and stable reception characteristics can be obtained.

In the transimpedance amplifier circuit 10, a single control loop (the single integrating circuit 41 and the single control circuit 51) can realize the DC offset control and the gain control, so that an increase of the circuit scale can be suppressed. Furthermore, the optical input level can be arbitrarily controlled by adjusting a response of the control circuit 51 (amplification factor α, amplification factor γ, current value of offset current Iofs, etc.).

As described above, in the transimpedance amplifier circuit 10, the feedback current source 52 generates the DC bypass current Iaoc, the variable resistance circuit 53 generates the AC bypass current Iagc1, and the DC bypass current Iaoc and the AC bypass current Iagc1 are drawn from the photocurrent Ipd generated by the photodetector PD, so that the current signal Iin is generated. Then, the TIA unit 11 converts the current signal Iin into the voltage signal Vtia, and the differential amplifier circuit 13 generates the differential voltage signal Vout,Voutb in accordance with the difference ΔVtia between the voltage signal Vtia and the reference voltage signal Vref.

The control current Icnt is generated based on the integrated value of the difference ΔVtia, and the feedback current source 52 is controlled so that the DC bypass current Iaoc increases as the control current Icnt increases. Therefore, the DC component of the photocurrent Ipd is drawn as the DC bypass current Iaoc from the photocurrent Ipd, whereby the DC component is removed from the photocurrent Ipd. On the other hand, when the control current Icnt exceeds the current value of the offset current Iofs, the variable resistance circuit 53 is controlled so that the AC bypass current Iagc1 increases as the control current Icnt increases. Thus, when the photocurrent Ipd is relatively small, although the DC component of the photocurrent Ipd is drawn as the DC bypass current Iaoc, the drawing of the AC bypass current Iagc1 is suppressed. Therefore, attenuation of the AC component of the photocurrent Ipd can be avoided while removing the DC component of the photocurrent Ipd. When the photocurrent Ipd is relatively large, the DC component of the photocurrent Ipd is drawn as the DC bypass current Iaoc, and the AC component of the photocurrent Ipd is drawn as the AC bypass current Iagc1 from the photocurrent Ipd. Therefore, the AC component of the photocurrent Ipd can be attenuated while removing the DC component of the photocurrent Ipd. Since the feedback current source 52 and the variable resistance circuit 53 are both controlled by one control circuit 51, control of DC component removal (DC offset control) and gain control can be performed with a single control loop. As a result, it is possible to perform the DC offset control and the gain control while suppressing the circuit scale.

In the feedback current source 52, the field effect transistor 54 is diode-connected, so that when the drain of the field effect transistor 54 receives the control current Iaoccnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance Zin of the TIA unit 11. For example, when the input impedance of the TIA unit 11 is Zin, the output impedance of the output terminal 52b may be set to 100×Zin or more. Since the input impedance Zin and the output impedance of the output terminal 52b can have different frequency characteristics from each other, it is sufficient that such a relationship is satisfied at least in a predetermined frequency range (band).

In the variable resistance circuit 53, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other. Therefore, the gate-source voltage of the field effect transistor 57 is equal to the gate-source voltage Vgs2. The reference voltage signal Vref is supplied to the source of the field effect transistor 57, and the drain of the field effect transistor 57 is electrically connected to the input terminal 10a, so that there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases. Since there is almost no potential difference between the drain and source of the field effect transistor 57, although the DC component of the photocurrent Ipd hardly flows into the field effect transistor 57, the AC component of the photocurrent Ipd may flow as the AC bypass current Iagc1 into the field effect transistor 57. Then, when the control current Icnt exceeds the current value of the offset current Iofs, the gate-source voltage Vgs2 of the field effect transistor 56 increases as the control current Icnt increases. Therefore, when the photocurrent Ipd is relatively small, the drawing of the AC bypass current Iagc1 is suppressed, so that the attenuation of the AC component can be avoided. When the photocurrent Ipd is relatively large, the AC component of the photocurrent Ipd is drawn as the AC bypass current Iagc1 from the photocurrent Ipd, so that the AC component of the photocurrent Ipd can be attenuated. Therefore, the variable resistance circuit 53 controls a gain of the transimpedance amplifier circuit 10.

An output impedance of the resistance terminal 53b may be determined in consideration of the input impedance Zin of the TIA unit 11. For example, when a variable gain ratio of the TIA unit 11 is A (A is a real number larger than 1), the output impedance of the resistance terminal 53b is set to Zin/(A−1). Thus, when the value of the current signal Iin of the TIA unit 11 when the AGC is not performed is Iinoff, a value Iinon of the current signal Iin when the AGC is performed is Iinon=Iinoff/A. For example, when A=2, the output impedance of the resistance terminal 53b is substantially equal to Zin, and when A is larger than 2, the output impedance of the resistance terminal 53b is a value smaller than Zin. Therefore, when the AOC and the AGC are performed simultaneously, the output impedance of the output terminal 52b is set to be larger than the output impedance of the resistance terminal 53b. When the AGC is not performed, the output impedance of the resistance terminal 53b may be set to 100×Zin or more. The output impedance of the resistance terminal 53b can be considered to be equal to the resistance value $R_{AGC1}$ described above. For example, making the gate voltage of the field effect transistor 57 approximately equal to the threshold voltage of the field effect transistor 57 increases the output impedance of the resistance terminal 53b. Since the input impedance Zin and the output impedance of the resistance terminal 53b may have different frequency characteristics from each other, it is sufficient that the above-described relationship is satisfied at least in a predetermined frequency range (band).

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuit 53 viewed from the input terminal of the TIA unit 11 is low in a wide frequency range. Thus, the AC bypass current Iagc1 can be easily drawn from the photocurrent Ipd.

Since the DC offset control is performed using the high-impedance feedback current source 52, the AC component of the photocurrent Ipd is less affected (the AC component does not flow to the feedback current source 52). On the other hand, the gain control is performed by bypassing the AC component of the photocurrent Ipd using the variable resistance circuit 53, and the drain potential and the source potential of the field effect transistor 57 are substantially equal to each other, so that the DC component of the photocurrent Ipd is less affected (no DC component flows to the variable resistance circuit 53). As a result, interference between the DC offset control and the gain control can be avoided.

As described above, according to the transimpedance amplifier circuit 10, the gain control of the transimpedance amplifier circuit 10 and the DC offset control for setting the difference ΔVtia to 0 can be controlled by a single control loop without interfering with each other.

Figure 6:
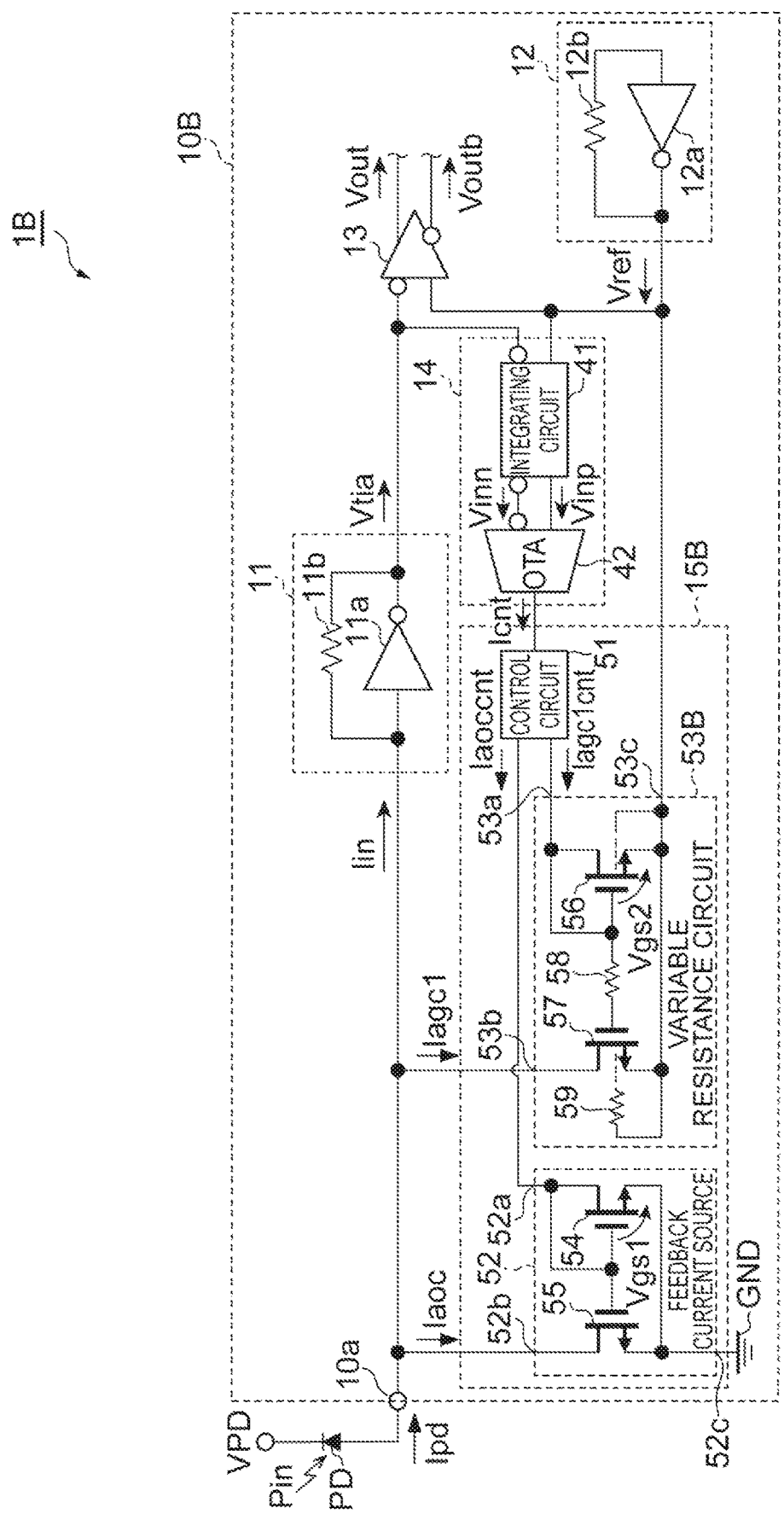
FIG. 6 is a diagram schematically showing a configuration of an optical receiving device including a transimpedance amplifier circuit according to another embodiment.
Figure 7:
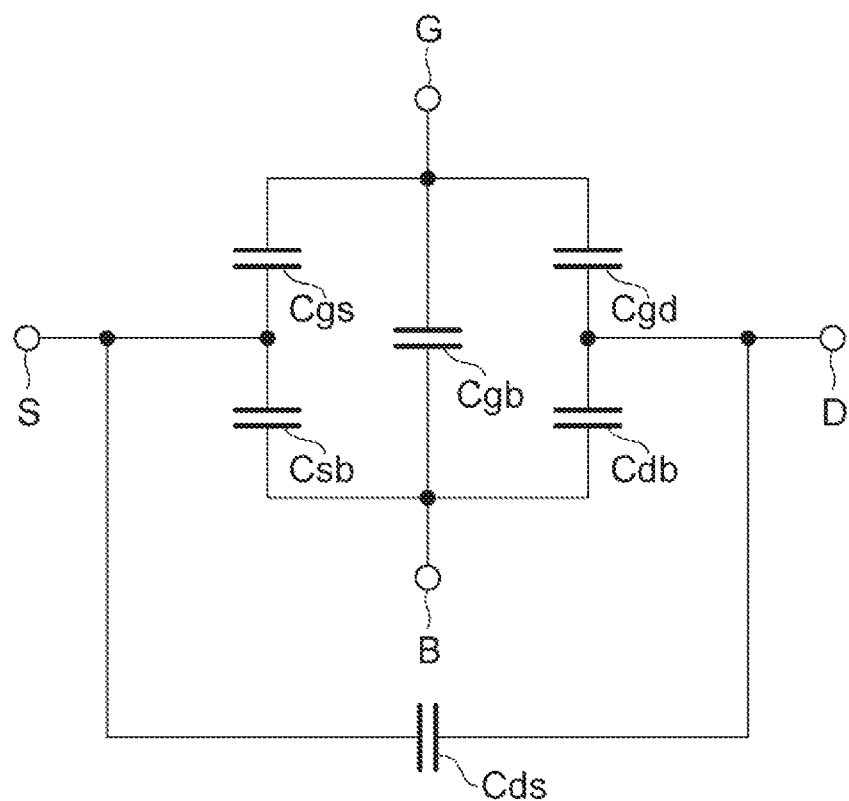
FIG. 7 is a diagram for explaining an inter-terminal capacitance of a field effect transistor shown in FIG. 6.

Next, a transimpedance amplifier circuit according to another embodiment will be described with reference to FIGS. 6 to 8. FIG. 6 is a diagram schematically showing a configuration of an optical receiving device including a transimpedance amplifier circuit according to another embodiment. FIG. 7 is a diagram for explaining an inter-terminal capacitance of a field effect transistor shown in FIG. 6. FIG. 8 is a diagram showing an example of a capacitance value of the inter-terminal capacitance shown in FIG. 7.

As shown in FIG. 6, an optical receiving device 1B mainly differs from the optical receiving device 1 in that the optical receiving device 1B includes a transimpedance amplifier circuit 10B instead of the transimpedance amplifier circuit 10. The transimpedance amplifier circuit 10B mainly differs from the transimpedance amplifier circuit 10 in that the transimpedance amplifier circuit 10B includes a bypass circuit 15B instead of the bypass circuit 15. The bypass circuit 15B mainly differs from the bypass circuit 15 in that the bypass circuit 15B includes a variable resistance circuit 53B (first variable resistance circuit) instead of the variable resistance circuit 53. The variable resistance circuit 53B mainly differs from the variable resistance circuit 53 in that the variable resistance circuit 53B further includes a resistance element (resistor) 58 (first resistance element) and a resistance element (resistor) 59 (second resistance element). In the variable resistance circuit 53B, a gate of a field effect transistor 57 is electrically connected to a drain and a gate of a field effect transistor 56 via the resistance element 58.

Here, although not usually shown in the circuit diagram, the field effect transistor has a substrate terminal. A substrate terminal (indicated by a dotted line in FIG. 6; first substrate terminal) of the field effect transistor 56 is electrically connected to an output terminal of a reference voltage generation circuit 12 (voltage amplifier 12a) via a resistance terminal 53c. A reference voltage signal Vref is input (supplied) to the substrate terminal of the field effect transistor 56. A substrate terminal (second substrate terminal) of the field effect transistor 57 is electrically connected to the output terminal of the reference voltage generation circuit 12 (voltage amplifier 12a) via the resistance element 59 and the resistance terminal 53c. The reference voltage signal Vref is input (supplied) to the substrate terminal of the field effect transistor 57 via the resistance element 59. Since no DC current flows to the substrate terminal of the field effect transistor 57, a (DC) potential of the substrate terminal of the field effect transistor 57 is set to a potential of the reference voltage signal Vref, similarly to a (DC) potential of the substrate terminal of the field effect transistor 56.

As shown in FIG. 7, the field effect transistor 57 has a capacitance component between the gate (G), the source (S), the drain (D), and the substrate terminal (B). FIG. 8 shows an example of a capacitance value of each capacitance component. The capacitance value shown in FIG. 8 is a typical capacitance value when the field effect transistor 57 is a 130 nm CMOS process, a gate width (channel width) W of the field effect transistor 57 is 30 μm, a gate length (channel length) L of the field effect transistor 57 is 0.13 μm, and the field effect transistor 57 operates in a deep triode region.

A capacitance value of a gate-source capacitance Cgs (second capacitance) and a capacitance value of a gate-drain capacitance Cgd (first capacitance) are equal to each other, which is 7.1 fF. The capacitance value of a drain-source capacitance Cds is 2.6 fF. A capacitance value of a capacitance Cgb between the gate and the substrate terminal, a capacitance value of a capacitance Csb (fourth capacitance) between the source and the substrate terminal, and a capacitance value of a capacitance Cdb (third capacitance) between the drain and the substrate terminal are equal to each other, which is 0.6 fF. As described above, the field effect transistor 57 has symmetrical capacitances (capacitance Cgs and capacitance Cgd) on the source side and the drain side with respect to the gate. In other words, the field effect transistor 57 is configured such that the capacitance Cgd and the capacitance Cgs are equal to each other. Similarly, the field effect transistor 57 has symmetrical capacitances (capacitance Csb and capacitance Cdb) on the source side and the drain side also with respect to the substrate terminal. In other words, the field effect transistor 57 is configured such that the capacitance Cdb and the capacitance Csb are equal to each other.

In a case where the number of fingers indicating the number of gates of the field effect transistor is an odd number, when the number of drains and the number of sources are made equal, the field effect transistor 57 in which the capacitance value of the capacitance Cgs and the capacitance value of the capacitance Cgd are equal to each other and the capacitance value of the capacitance Csb and the capacitance value of the capacitance Cdb are equal to each other can be obtained. For example, in a case of a MOS transistor having three fingers, the MOS transistor may be configured to have the drain D, the gate G, the source S, the gate G, the drain D, the gate G, and the source S in this order.

The capacitance value of the capacitance Csb is about 1/10 of the capacitance value of the capacitance Cgs, and the capacitance value of the capacitance Cdb is about 1/10 of the capacitance value of the capacitance Cgd. While the capacitances Csb and Cdb have a junction capacitance associated with a PN junction as a main component, the capacitances Cgs and Cgd have an overlap capacitance due to a gate oxide film as a main component. As described above, the capacitances Csb and Cdb are sufficiently smaller than the capacitances Cgs and Cgd unless the areas of the source and drain are intentionally increased.

A resistance value Rg of the resistance element 58 is sufficiently larger than an impedance Zcgd due to the capacitance Cgd and an impedance Zcgs due to the capacitance Cgs at high frequencies. A resistance value Rb of the resistance element 59 is sufficiently larger than an impedance Zcdb due to the capacitance Cdb and the impedance Zcsb due to the capacitance Csb.

In the variable resistance circuit 53B configured as above, the control current Iagc1cnt flowing from the control terminal 53a flows to the field effect transistor 56 diode-connected, so that a gate-source voltage Vgs2 is generated between the gate and source of the field effect transistor 56. The gate of the field effect transistor 56 and the gate of the field effect transistor 57 are electrically connected to each other via the resistance element 58, and the source of the field effect transistor 56 and the source of the field effect transistor 57 are electrically connected to each other. Since gate resistances of the field effect transistors 56 and 57 are much larger than the resistance value of the resistance element 58, a gate-source voltage of the field effect transistor 57 is equal to the gate-source voltage Vgs2. The reference voltage signal Vref is supplied to the source of the field effect transistor 57, and the input potential of the TIA unit 11 is applied to the drain of the field effect transistor 57. Since the reference voltage signal Vref has substantially the same potential as the input potential of the TIA unit 11, the field effect transistor 57 operates in a deep triode region (linear region). When the drain voltage of the field effect transistor 57 increases in the linear region, the drain current increases accordingly. Especially when the drain voltage is relatively small, the drain current can be considered changed (linearly) in proportion to the drain voltage. That is, the reference voltage generation circuit 12 grounds the field effect transistors 56 and 57 of the variable resistance circuit 53B in an alternating current manner and the field effect transistor 57 is biased in the deep triode region.

Here, since the field effect transistor 56 is diode-connected, the gate of the field effect transistor 57 is electrically connected to the output terminal of the reference voltage generation circuit 12 (voltage amplifier 12a) by the resistance element 58 and the differential resistance of the diode-connected field effect transistor 56. A differential resistance value of the diode-connected field effect transistor 56 is about several kΩ, which is considerably smaller than the impedance Zcgd due to the capacitance Cgd of the field effect transistor 57. The impedance Zcgd is, for example, 22 kΩ at 1 GHz. Assuming that the resistance value Rg of the resistance element 58 is 0 Ω, a gate potential of the field effect transistor 56 follows a low-impedance source potential (potential of the reference voltage signal Vref). In this case, as shown in the above Formula (2), the gate-source voltage Vgs2 is expressed by adding the drain-source voltage Vds to the gate-source voltage Vgs0.

Therefore, also in the variable resistance circuit 53B, a drain current Id of the field effect transistor 57 biased in the triode region (that is, the AC bypass current Iagc1) may be represented by the above Formula (3), and a resistance value $R_{AGC1}$ may be represented by the above Formula (4). Similarly, since a transconductance gm in the triode region may be represented by the above Formula (5), the transconductance gin in the triode region becomes negligibly small as compared with the transconductance in saturation operation.

On the other hand, since the resistance value Rg of the resistance element 58 is larger than the impedance Zcgd due to the capacitance Cgd (Rg>>Zcgd), the resistance element 58 isolates the gate of the field effect transistor 57 from the gate of the field effect transistor 56 in a high-frequency manner (in an alternating current manner). Since the capacitance value of the capacitance Cgs and the capacitance value of the capacitance Cgd are equal to each other, the drain-source voltage Vds is divided into half, and a voltage (Vds/2) which is half of the drain-source voltage Vds is applied to the gate of the field effect transistor 57.

Since the gate of the field effect transistor 57 can be electrically continuous with the substrate terminal of the field effect transistor 57 in a high frequency manner via the capacitance Cgb, the potential of the substrate terminal of the field effect transistor 57 can slightly affect the gate potential of the field effect transistor 57 via the capacitance Cgb. However, since the resistance value Rb of the resistance element 59 is larger than the impedance Zcdb due to the capacitance Cdb (Rb>>Zcdb), the resistance element 59 isolates the substrate terminal of the field effect transistor 57 from the source of the field effect transistor 57 in a high-frequency manner Since the capacitance value of the capacitance Csb and the capacitance value of the capacitance Cdb are equal to each other, the drain-source voltage Vds is divided into half, and the voltage (Vds/2) which is half of the drain-source voltage Vds is applied to the substrate terminal of the field effect transistor 57. Thus, the influence of the potential of the substrate terminal of the field effect transistor 57 on the gate potential of the field effect transistor 57 is reduced.

In this case, as shown in Formula (6), the gate-source voltage Vgs2 is expressed by adding half of the drain-source voltage Vds to the gate-source voltage Vgs0.

[Formula 6]

$$Vgs2 = Vgs0 + \frac{Vds}{2} \quad (6)$$

Formula (7) is obtained by substituting Formula (6) into Formula (1). As shown in Formula (7), the drain current Id (AC bypass current Iagc1) is proportional to the drain-source voltage Vds, and thus does not include a non-linear component.

[Formula 7]

$$Iagc1 = Id = \frac{\beta}{2} \times \left\{ 2 \times \left( Vgs0 + \frac{Vds}{2} - Vth \right) \times Vds - Vds^2 \right\} = \quad (7)$$
$$\beta \times (Vgs0 - Vth) \times Vds$$

As shown in Formula (8), the differential resistance value Rd (resistance value $R_{AGC1}$) is obtained by differentiating Formula (7) with respect to the drain-source voltage Vds and calculating a reciprocal of the calculation result. As shown in Formula (8), the resistance value $R_{AGC1}$ does not change with the drain-source voltage Vds.

[Formula 8]

$$R_{AGC1} = Rd = \frac{1}{\frac{\partial Id}{\partial Vds}} = \frac{1}{\beta \times (Vgs0 - Vth)} \quad (8)$$

In other words, by superimposing half (Vds/2) of the drain-source voltage Vds on the gate voltage of the field effect transistor 57 operating in the triode region, the differential resistance value Rd (resistance value $R_{AGC1}$) of the field effect transistor 57 does not depend on the drain-source voltage Vds, and does not vary from a resistance value when the drain-source voltage Vds is 0 V.

That is, although the variable resistance circuit 53B has the same circuit configuration as a feedback current source 52, the variable resistance circuit 53B does not operate as a current mirror circuit, and the field effect transistor 57 operates as a linear variable resistor controlled by the gate-source voltage Vgs2. Since a potential of the resistance terminal 53b and a potential of the resistance terminal 53c are substantially the same, the DC component of a photocurrent Ipd hardly flows to the variable resistance circuit 53B, and the AC component of the photocurrent Ipd partially flows as the AC bypass current Iagc1 into the variable resistance circuit 53B (field effect transistor 57). In other words, the variable resistance circuit 53B flows the AC bypass current Iagc1 between the drain and source of the field effect transistor 57 in accordance with the control current Iagc1cnt.

That is, the photocurrent Ipd increases, the difference ΔVtia increases, and when the control current Icnt exceeds the current value of the offset current Iofs, the control current Iagc1cnt is supplied to the variable resistance circuit 53B. As a result, the gate-source voltage Vgs2 is generated in the field effect transistors 56 and 57. As the gate-source voltage Vgs2 increases, the resistance value $R_{AGC1}$ of the field effect transistor 57 decreases, so that the signal component (AC component) of the photocurrent Ipd excluding the DC component is partially drawn as the AC bypass current Iagc1. As a result, a possibility that the TIA unit 11 will be saturated by a large signal input is reduced.

As described above, a current proportional to the drain-source voltage flows between the drain and source of the field effect transistor 57 biased in the deep triode region (linear region). Since the reference voltage signal Vref has substantially the same potential as the input potential of the TIA unit 11, no DC current flows, and the AC bypass current Iagc1 does not disturb the DC offset control. The change in the resistance value $R_{AGC1}$ of the field effect transistor 57 affects only characteristics of an AOC control gain.

Since the resistance value $R_{AGC1}$ of the field effect transistor 57 does not depend on the drain-source voltage Vds, the AC bypass current Iagc1 is drawn from the photocurrent Ipd with low distortion. As a result, occurrence of distortion is suppressed.

Figure 9C:
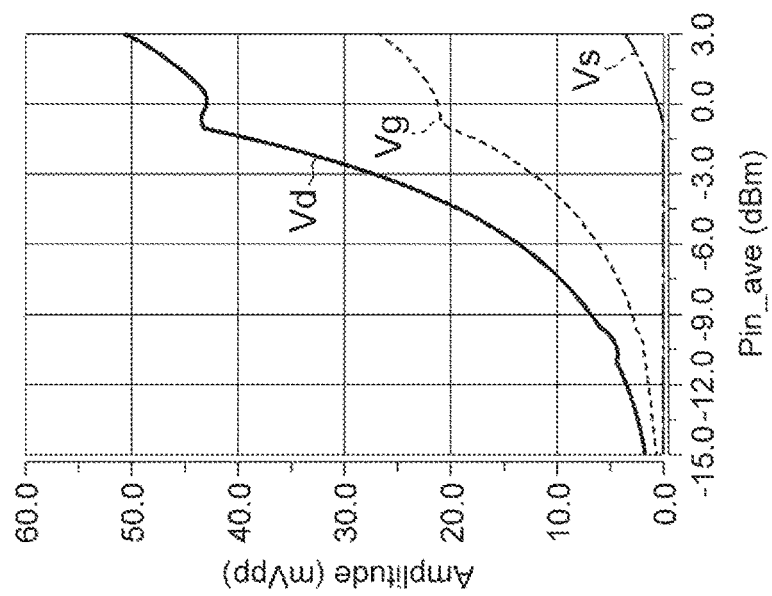
FIG. 9C is a diagram showing a change in amplitude at each terminal of the field effect transistor with respect to the average input light power in the transimpedance amplifier circuit shown in FIG. 6.
Figure 9B:
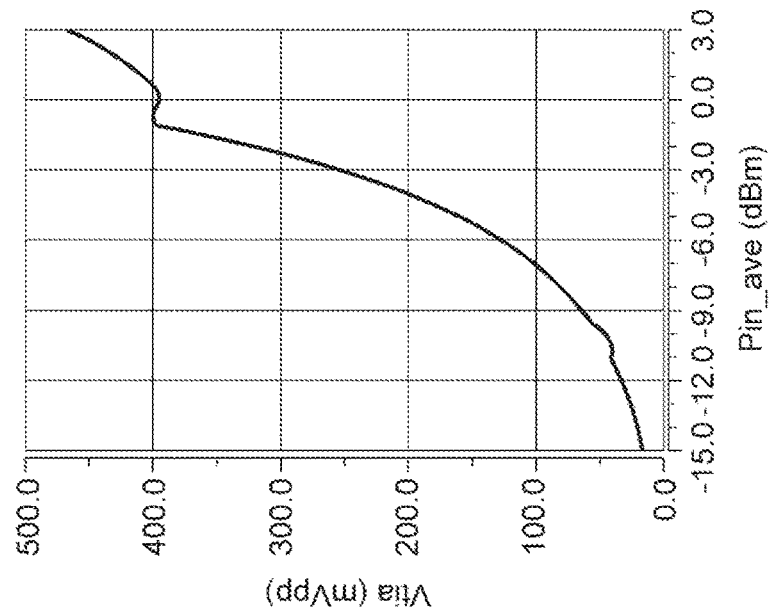
FIG. 9B is a diagram showing a change in output amplitude of a TIA unit with respect to the average input light power in the transimpedance amplifier circuit shown in FIG. 6.
Figure 9A:
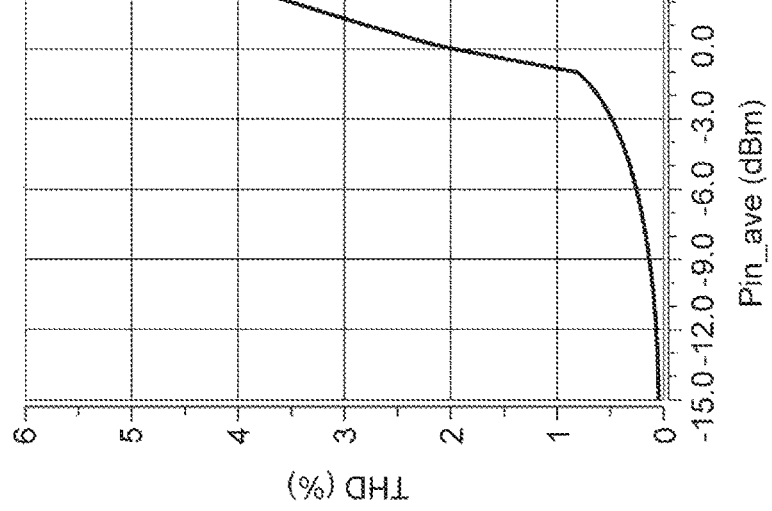
FIG. 9A is a diagram showing a change in total harmonic distortion with respect to an average input light power in the transimpedance amplifier circuit shown in FIG. 6.
Figure 10C:
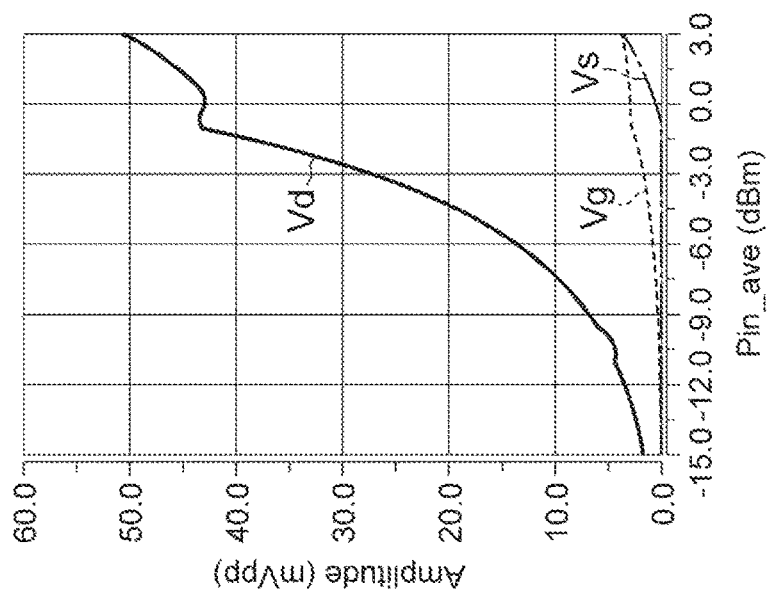
FIG. 10C is a diagram showing a change in amplitude at each terminal of a field effect transistor with respect to the average input light power in the transimpedance amplifier circuit of the first comparative example.
Figure 10B:
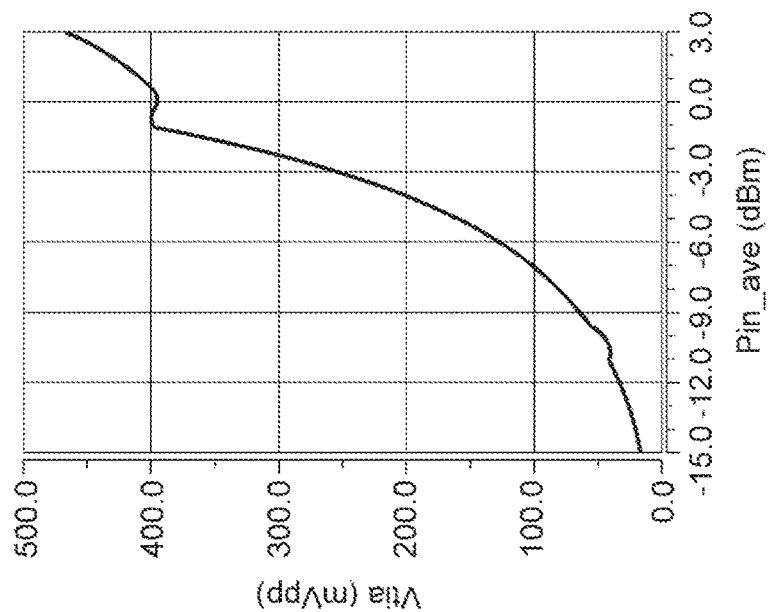
FIG. 10B is a diagram showing a change in output amplitude of a TIA unit with respect to the average input light power in the transimpedance amplifier circuit of the first comparative example.
Figure 10A:
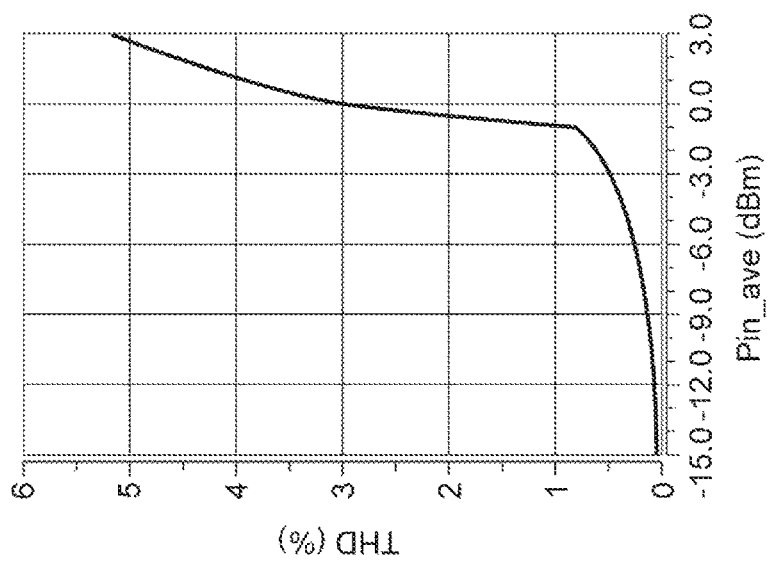
FIG. 10A is a diagram showing a change in total harmonic distortion with respect to an average input light power in a transimpedance amplifier circuit of a first comparative example.

Next, the function and effect of the transimpedance amplifier circuit 10B will be described. FIG. 9A is a diagram showing a change in total harmonic distortion with respect to an average input light power in the transimpedance amplifier circuit shown in FIG. 6. FIG. 9B is a diagram showing a change in output amplitude of a TIA unit with respect to the average input light power in the transimpedance amplifier circuit shown in FIG. 6. FIG. 9C is a diagram showing a change in amplitude at each terminal of the field effect transistor with respect to the average input light power in the transimpedance amplifier circuit shown in FIG. 6. FIG. 10A is a diagram showing a change in total harmonic distortion with respect to an average input light power in a transimpedance amplifier circuit of a first comparative example. FIG. 10B is a diagram showing a change in output amplitude of a TIA unit with respect to the average input light power in the transimpedance amplifier circuit of the first comparative example. FIG. 10C is a diagram showing a change in amplitude at each terminal of a field effect transistor with respect to the average input light power in the transimpedance amplifier circuit of the first comparative example.

The horizontal axes of FIGS. 9A to 9C and FIGS. 10A to 10C represent an average input light power Pin_ave (unit: dBm), that is an average value of an optical input power of an optical signal Pin. The vertical axes of FIGS. 9A and 10A represent the total harmonic distortion (THD) (unit: %) of an output waveform (waveform of the differential voltage signal Vout,Voutb). The vertical axes of FIGS. 9B and 10B represent an amplitude (unit: mVpp) of a voltage signal Vtia. The vertical axes in FIGS. 9C and 10C represent amplitudes (unit: mVpp) of a drain potential Vd, a gate potential Vg, and a source potential Vs of the field effect transistor 57.

The calculation results shown in FIGS. 9A to 9C are the calculation results in the transimpedance amplifier circuit 10B (hereinafter, referred to as "first example"). The calculation results shown in FIGS. 10A to 10C are the calculation results in the transimpedance amplifier circuit of the first comparative example (hereinafter, referred to as "first comparative example"). The transimpedance amplifier circuit of the first comparative example mainly differs from the transimpedance amplifier circuit 10B in the resistance value Rg of the resistance element 58 and the resistance value Rb of the resistance element 59. In the transimpedance amplifier circuit of the first example, the resistance value Rg of the resistance element 58 is set to 200 kΩ, and the resistance value Rb of the resistance element 59 is set to 5 kΩ. In the transimpedance amplifier circuit of the first comparative example, both the resistance value Rg of the resistance element 58 and the resistance value Rb of the resistance element 59 are set to 0Ω.

The current value of the offset current Iofs is set so that the AGC operates when the average input light power Pin_ave exceeds around −1 dBm. As the total harmonic distortion, the total harmonic distortion considering up to the 10th harmonic is calculated. In order to prevent distortion from occurring in a differential amplifier circuit 13 provided at the next stage, the size of the field effect transistor 57 is determined so that the maximum amplitude of the voltage signal Vtia does not exceed 500 mVpp. A gain (voltage gain) of the TIA unit 11 is set to 10 times, and a resistance value of a feedback resistance element 11b is set to 550Ω. As the optical signal Pin, an optical signal obtained by intensity modulation with a 1 GHz sine wave is used, and the amplitude of the optical signal Pin is set to be the same as the average input light power Pin_ave (extinction ratio of about 5 dB). A photoelectric conversion gain of the photodetector PD is set to 1.0 A/W in order to simplify the calculation.

Comparing FIG. 9A and FIG. 10A, it can be seen that when the average input light power Pin_ave is 3 dBm, the THD is 5.2% in the first comparative example, whereas the THD is reduced to 4.1% in the first example. Comparing FIG. 9B and FIG. 10B, it can be seen that the amplitudes of the voltage signals Vtia are controlled to be equal to each other in the first comparative example and the first example. That is, it can be seen that although an amount of drawing of the AC bypass current Iagc1 in the first example is equivalent to that in the first comparative example, the THD of the first example is improved compared to the THD of the first comparative example. According to FIG. 10C, since the gate-source voltage Vgs2 of the first comparative example is represented by Formula (2), it can be seen that the amplitude of the gate potential Vg is substantially equal to the amplitude of the source potential Vs. On the other hand, according to FIG. 9C, it can be seen that in the first example, the amplitude of the gate potential Vg is approximately half the amplitude of the drain potential Vd. This indicates that the drain-source voltage Vds of the field effect transistor 57 is divided by the capacitance Cgs and the capacitance Cgd, and the gate-source voltage Vgs2 is represented by Formula (6). According to FIGS. 9C and 10C, in both the first comparative example and the first example, when the average input light power Pin_ave exceeds −1 dB, the amplitude of the source potential Vs increases. This is due to the fact that since the output impedance of the reference voltage generation circuit 12 is not 0, the reference voltage signal Vref is modulated by the photocurrent Ipd as the AC bypass current Iagc1 increases. As described above, during gain control (during the AGC operation), the THD can be improved by about 1% in the first example compared to the first comparative example.

As described above, in the transimpedance amplifier circuit 10B, the bypass circuit 15B generates the DC bypass current Iaoc and the AC bypass current Iagc1, and the DC bypass current Iaoc and the AC bypass current Iagc1 are drawn from the photocurrent Ipd generated by the photodetector PD, so that the current signal Iin is generated. Then, the TIA unit 11 converts the current signal Iin into the voltage signal Vtia, and the differential amplifier circuit 13 generates the differential voltage signal Vout,Voutb in accordance with the difference ΔVtia between the voltage signal Vtia and the reference voltage signal Vref. In the variable resistance circuit 53B, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other via the resistance element 58, and the reference voltage signal Vref is supplied to the source of the field effect transistor 56 and the source of the field effect transistor 57. Since the gate resistances of the field effect transistors 56 and 57 are much larger than the resistance value Rg of the resistance element 58, the gate-source voltage of the field effect transistor 57 is equal to the gate-source voltage Vgs2.

The reference voltage signal Vref is supplied to the source of the field effect transistor 57, and the drain of the field effect transistor 57 is electrically connected to the input terminal 10a, so that there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases. Since there is almost no potential difference between the drain and source of the field effect transistor 57, although the DC component of the photocurrent Ipd hardly flows into the field effect transistor 57, the AC component of the photocurrent Ipd may flow as the AC bypass current Iagc1 into the field effect transistor 57. The control current Iagc1cnt is obtained by amplifying a difference (difference current) between a current generated by amplifying the control current Icnt and the offset current Iofs with the amplification factor γ. Therefore, when the control current Icnt exceeds the current value of the offset current Iofs, the control current Iagc1cnt increases as the control current Icnt increases, and the gate-source voltage Vgs2 of the field effect transistor 56 also increases. Thus, when the photocurrent Ipd has a small or medium signal intensity, the drawing of the AC bypass current Iagc1 is suppressed, so that the attenuation of the AC component of the photocurrent Ipd can be avoided. When the photocurrent Ipd has a large signal intensity, the AC component of the photocurrent Ipd is drawn as the AC bypass current Iagc1 from the photocurrent Ipd, so that the AC component of the photocurrent Ipd can be attenuated. Thus, the variable resistance circuit 53B controls a gain of the transimpedance amplifier circuit 10B.

The gate of the field effect transistor 57 is electrically connected to the gate of the field effect transistor 56 via the resistance element 58, and the field effect transistor 56 is diode-connected, so that the gate of the field effect transistor 57 is connected to the output terminal (reference voltage signal Vref) of the reference voltage generation circuit 12 via the resistance element 58 and the differential resistance of the field effect transistor 56. However, since the resistance value Rg of the resistance element 58 is larger than the impedance Zcgd due to the capacitance Cgd, the resistance element 58 can isolate the gate of the field effect transistor 57 from the gate of the field effect transistor 56 in a high-frequency manner Therefore, a voltage obtained by dividing the drain-source voltage Vds by the capacitance Cgd and the capacitance Cgs is applied to the gate of the field effect transistor 57. Since the field effect transistor 57 is configured such that the capacitance Cgd and the capacitance Cgs are equal to each other, a voltage that is about half the drain-source voltage Vds is applied to the gate of the field effect transistor 57. As a result, the variation of the differential resistance value (resistance value $R_{AGC1}$) of the field effect transistor 57 due to the drain-source voltage Vds is suppressed. As a result, since occurrence of distortion is suppressed, a signal quality can be improved.

The output impedance of the resistance terminal 53b of the variable resistance circuit 53B may be determined in consideration of the input impedance Zin of the TIA unit 11, similarly to the output impedance of the resistance terminal 53b of the variable resistance circuit 53.

Since the substrate terminal of the field effect transistor 57 is electrically connected to the gate of the field effect transistor 57 via the capacitance Cgb, the potential of the substrate terminal of the field effect transistor 57 can affect the gate potential of the field effect transistor 57 via the capacitance Cgb. On the other hand, the reference voltage signal Vref is supplied to the substrate terminal of the field effect transistor 57 via the resistance element 59, and the resistance value Rb of the resistance element 59 is larger than the impedance Zcdb due to the capacitance Cdb (Rb>>Zcdb) and larger than the impedance Zcsb due to the capacitance Csb (Rb>>Zcsb), so that the resistance element 59 can isolate the substrate terminal of the field effect transistor 57 from the outside of the field effect transistor 57 in a high-frequency manner. Since the field effect transistor 57 is configured such that the capacitance Cdb and the capacitance Csb are equal to each other, a voltage that is about half the drain-source voltage Vds is applied to the substrate terminal of the field effect transistor 57. As a result, the potential of the substrate terminal of the field effect transistor 57 becomes approximately the same as the gate potential of the field effect transistor 57, so that the influence of the potential of the substrate terminal of the field effect transistor 57 on the gate potential of the field effect transistor 57 can be reduced. As a result, since the occurrence of distortion is further suppressed, the signal quality can be further improved.

The bypass circuit 15B includes the feedback current source 52 that generates the DC bypass current Iaoc based on the control current Icnt, and the variable resistance circuit 53B that generates the AC bypass current Iagc1 based on the control current Icnt. The control circuit 51 controls the feedback current source 52 so that the DC bypass current Iaoc increases as the control current Icnt increases, and controls the variable resistance circuit 53B so that the AC bypass current Iagc1 increases as the control current Icnt increases when the control current Icnt exceeds the current value of the offset current Iofs. According to this configuration, it is possible to realize the control for removing the DC component and the gain control for the transimpedance amplifier circuit 10B with a single control loop, so that the increase of the circuit scale can be suppressed.

In the feedback current source 52, the field effect transistor 54 is diode-connected, so that when the drain of the field effect transistor 54 receives the control current Iaoccnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance of the TIA unit 11. For example, when the input impedance of the TIA unit 11 is Zin, the output impedance of the output terminal 52b may be set to 100×Zin or more. Since the input impedance Zin and the output impedance of the output terminal 52b may have different frequency characteristics from each other, it is sufficient that such a relationship is satisfied at least in a predetermined frequency range (band).

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuit 53B viewed from the input terminal of the TIA unit 11 is low in a wide frequency range. Thus, the AC bypass current Iagc1 can be easily drawn from the photocurrent Ipd.

Since the DC component is removed using the high-impedance feedback current source 52, the AC component of the photocurrent Ipd is less affected (no AC component flows to the feedback current source 52). On the other hand, the gain control is performed by bypassing the AC component of the photocurrent Ipd using the variable resistance circuit 53B, and the drain potential and the source potential of the field effect transistor 57 are substantially equal to each other, so that the DC component of the photocurrent Ipd is less affected (no DC component flows to the variable resistance circuit 53B). As a result, interference between the control of the removal of the DC component and the gain control can be avoided.

As described above, according to the transimpedance amplifier circuit 10B, the gain control of the transimpedance amplifier circuit 10B and the DC offset control for setting the difference ΔVtia to 0 can be performed by a single control loop without interfering with each other, and the gain control can be performed with low distortion.

Figure 11:
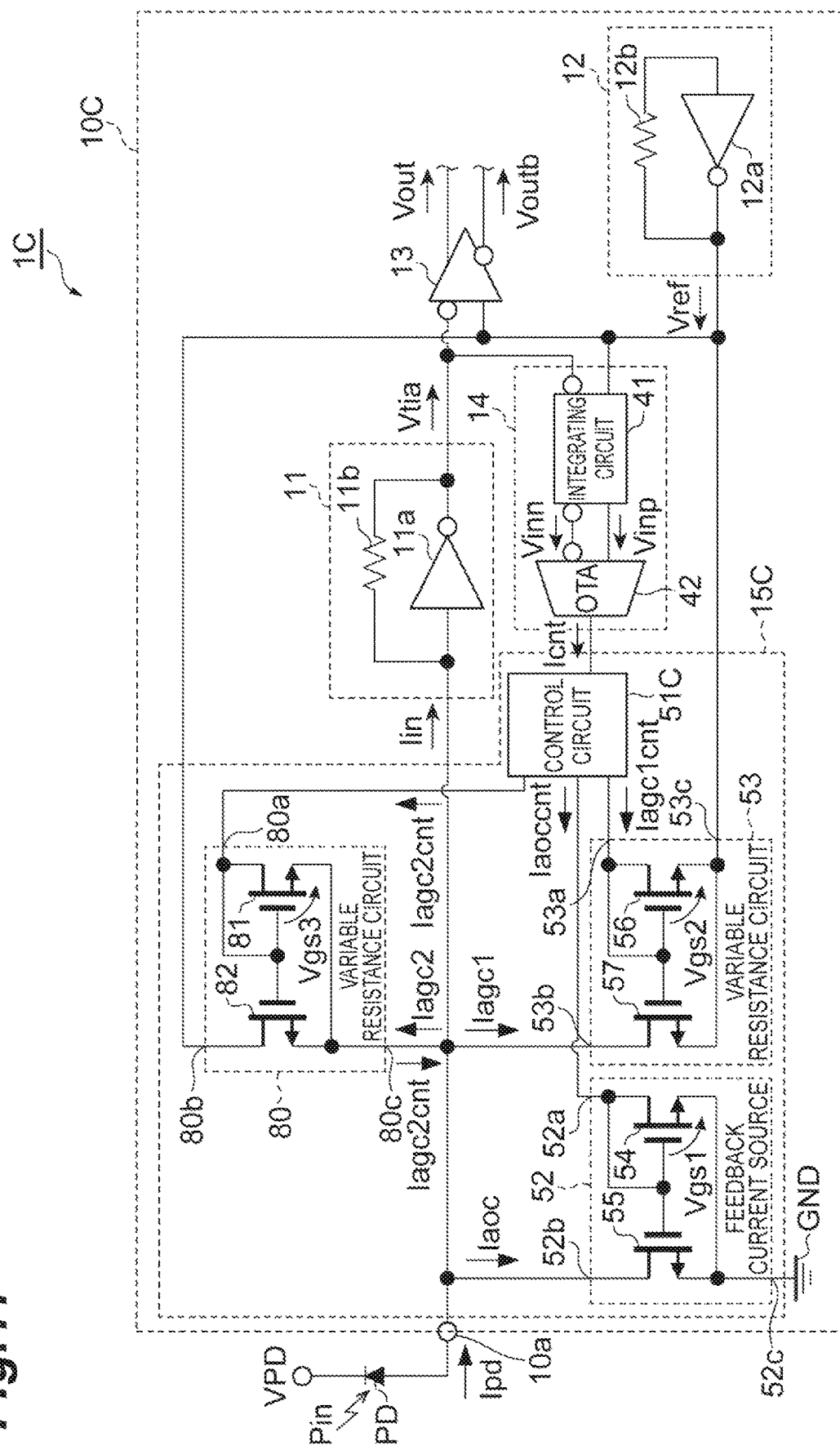
FIG. 11 is a diagram schematically showing a configuration of an optical receiving device including a transimpedance amplifier circuit according to still another embodiment.
Figure 12:
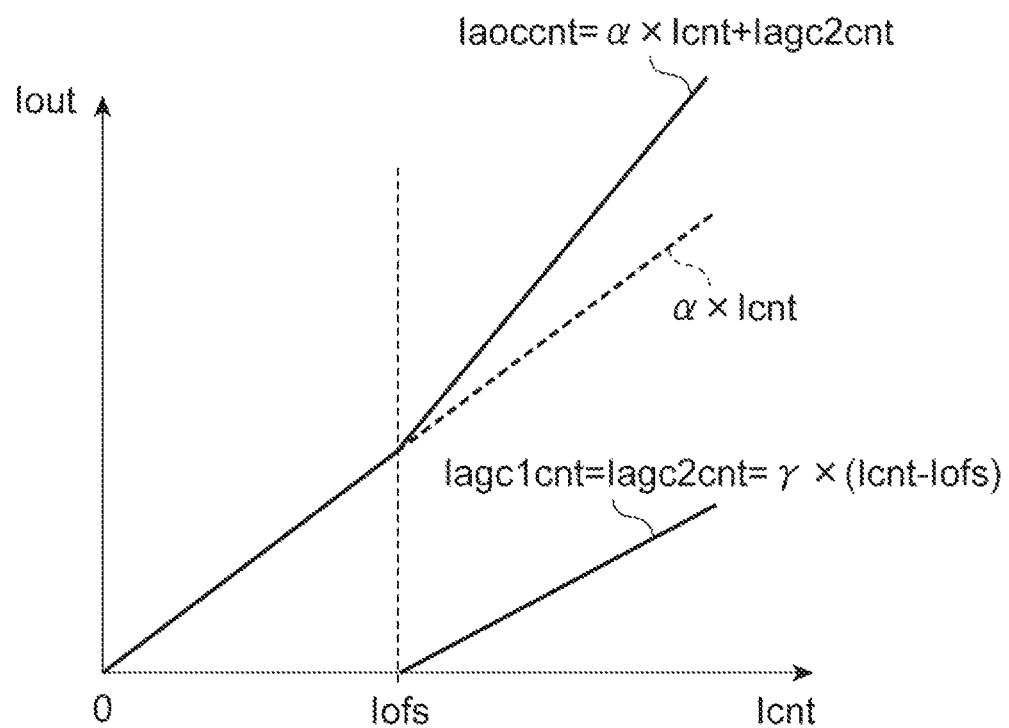
FIG. 12 is a diagram showing a relationship between a control current supplied to a control circuit shown in FIG. 11 and currents generated by the control circuit.
Figure 13:
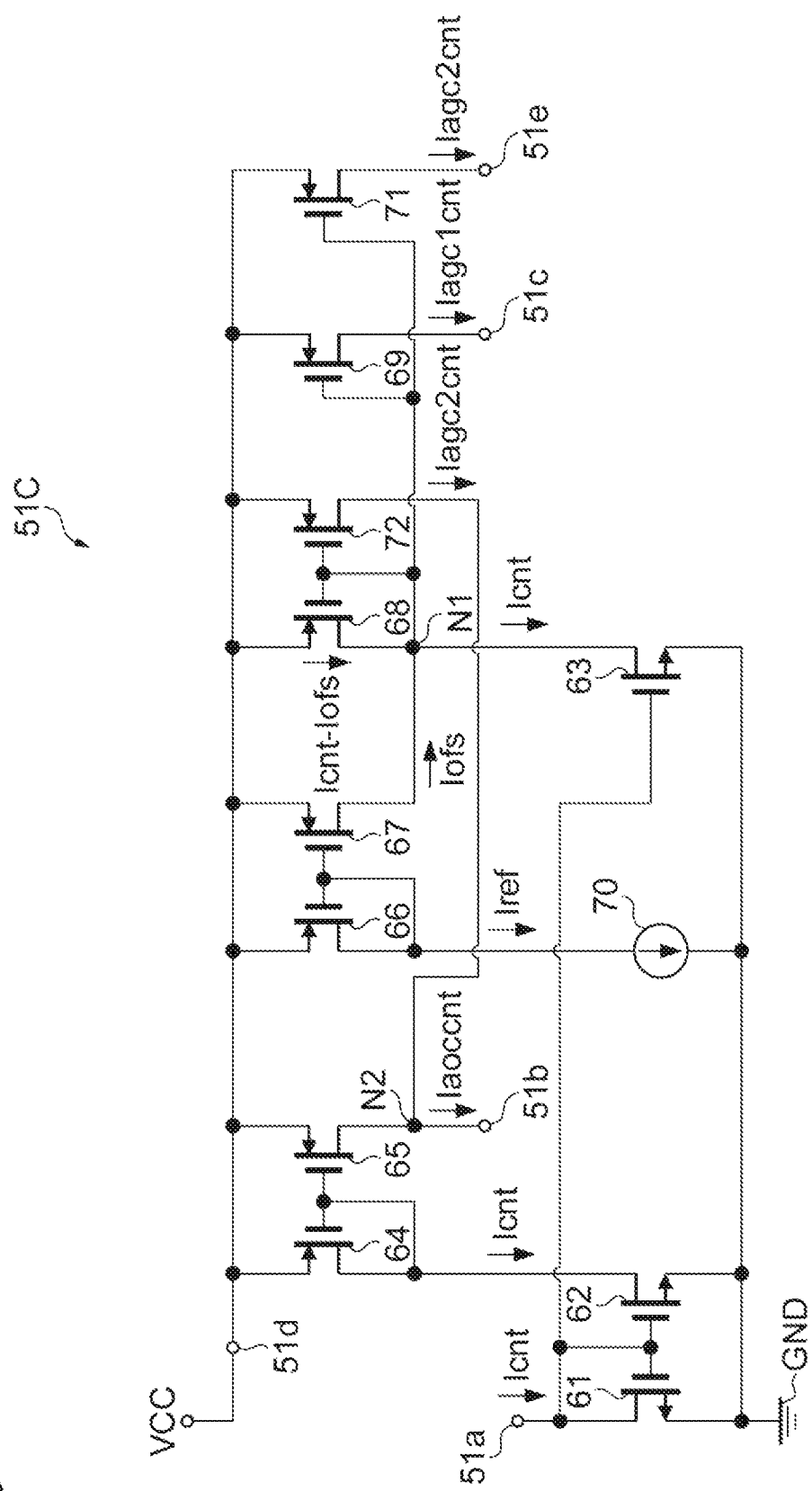
FIG. 13 is a diagram showing a circuit configuration example of the control circuit shown in FIG. 11.

Next, a transimpedance amplifier circuit according to still another embodiment will be described with reference to FIGS. 11 to 13. FIG. 11 is a diagram schematically showing a configuration of an optical receiving device including a transimpedance amplifier circuit according to still another embodiment. FIG. 12 is a diagram showing a relationship between a control current supplied to a control circuit shown in FIG. 11 and currents generated by the control circuit. FIG. 13 is a diagram showing a circuit configuration example of the control circuit shown in FIG. 11.

As shown in FIG. 11, an optical receiving device 1C mainly differs from the optical receiving device 1 in that the optical receiving device 1C includes a transimpedance amplifier circuit 10C instead of the transimpedance amplifier circuit 10. The transimpedance amplifier circuit 10C mainly differs from the transimpedance amplifier circuit 10 in that the transimpedance amplifier circuit 10C includes a bypass circuit 15C instead of the bypass circuit 15. In the transimpedance amplifier circuit 10C, the current signal Iin is generated by drawing the DC bypass current Iaoc, the AC bypass current Iagc1, and the AC bypass current Iagc2 (another AC bypass current, second AC bypass current) from the photocurrent Ipd.

The bypass circuit 15C mainly differs from the bypass circuit 15 in that the bypass circuit 15C generates the DC bypass current Iaoc, the AC bypass current Iagc1, and the AC bypass current Iagc2 based on the control current Icnt, that the bypass circuit 15C includes a control circuit 51C instead of the control circuit 51, and that the bypass circuit 15C further includes a variable resistance circuit 80 (another variable resistance circuit, second variable resistance circuit). The control circuit 51C mainly differs from the control circuit 51 in that when the control current Icnt exceeds the current value of the offset current Iofs, the control circuit 51C controls the variable resistance circuits 53 and 80 so that the AC bypass currents Iagc1 and Iagc2 increase as the control current Icnt increases.

Specifically, the control circuit 51C receives the control current Icnt from the control current circuit 14 (OTA 42), and generates the control current Iaoccnt, the control current Iagc1cnt, and the control current Iagc2cnt (third control current) in accordance with the control current Icnt. The control circuit 51C outputs the control current Iaoccnt to the feedback current source 52, and controls the feedback current source 52 by the control current Iaoccnt. The control circuit 51C outputs the control current Iagc1cnt to the variable resistance circuit 53, and controls the variable resistance circuit 53 by the control current Iagc1cnt. The control circuit 51C outputs the control current Iagc2cnt to the variable resistance circuit 80, and controls the variable resistance circuit 80 by the control current Iagc2cnt.

As shown in FIG. 12, the current values of the control current Iagc1cnt and the control current Iagc2cnt are proportional to the current value of the control current Icnt when the current value of the control current Icnt is larger than the current value of the offset current Iofs. In other words, the current values of the control current Iagc1cnt and the control current Iagc2cnt are γ times the current value obtained by subtracting the current value of the offset current Iofs from the control current Icnt (Iagc1cnt=Iagc2cnt=γ× (Icnt−Iofs)). The control circuit 51C, for example, generates the offset current Iofs having a predetermined current value (offset current value), and generates the control current Iagc1cnt and the control current Iagc2cnt by amplifying the difference (difference current) between the current (in this case, the control current Icnt), generated by amplifying the control current Icnt, and the offset current Iofs with the amplification factor γ.

The current value of the control current Iaoccnt is a value obtained by adding the current value of the control current Iagc2cnt to α times the current value of the control current Icnt (Iaoccnt=α×Icnt+Iagc2cnt). The control circuit 51C generates the control current Iaoccnt by, for example, adding the control current Iagc2cnt to a current generated by amplifying the control current Icnt with the amplification factor α. Thus, in the control current Iaoccnt, the amplification factor α is adjusted, and in the control currents Iagc1cnt and Iagc2cnt, an offset current value for determining a current for starting automatic gain control (AGC) and the amplification factor γ for determining the control sensitivity of the AGC are adjusted.

The control circuit 51C shown in FIG. 13 has a circuit configuration for realizing the control current Iaoccnt, the control current Iagc1cnt, and the control current Iagc2cnt shown in FIG. 12. As shown in FIG. 13, the circuit configuration of the control circuit 51C mainly differs from the circuit configuration of the control circuit 51 in that the control circuit 51C further includes an output terminal 51e and transistors 71 and 72. The output terminal 51e is electrically connected to a control terminal 80a of the variable resistance circuit 80, and outputs the control current Iagc2cnt to the variable resistance circuit 80.

The transistors 71 and 72 are, for example, field effect transistors (FETs) having a MOS structure. In the example shown in FIG. 13, the transistors 71 and 72 are P-channel MOS transistors. The transistors 68 and 71 and the transistors 68 and 72 each constitute a current mirror circuit. The transistor 68 functions as an input transistor, and the transistors 71 and 72 function as output transistors. Sources of the transistors 71 and 72 are electrically connected to the power supply terminal 51d. A gate of each of the transistors 71 and 72 is electrically connected to the gate and drain of the transistor 68. A drain of the transistor 71 is electrically connected to the output terminal 51e. A drain of the transistor 72 is electrically connected to the output terminal 51b via a node N2.

As described above, only when the current value of the control current Icnt is larger than the current value of the offset current Iofs, the difference current (Icnt−Iofs) flows to the drain of the transistor 68, and the output current (drain current) having a magnitude proportional to the magnitude of the drain current (difference current) of the transistor 68 is output as the control current Iagc1cnt from the drain of the transistor 69 and is output as the control current Iagc2cnt from each of the drains of the transistors 71 and 72.

In this case, the current mirror ratio of the current mirror circuit constituted by the transistors 68, 69, 71, and 72 is set to 1:γ:γ:γ. That is, the control currents Iagc1cnt and Iagc2cnt are currents (γ×(Icnt−Iofs)) having a magnitude obtained by amplifying the difference current (Icnt-Iofs) by γ times. The control current Iagc1cnt generated by the current mirror circuit of the transistors 68 and 69 flows from the drain of the transistor 69 toward the output terminal 51c. The control current Iagc2cnt generated by the current mirror circuit of the transistors 68 and 71 flows from the drain of the transistor 71 toward the output terminal 51e. The control current Iagc2cnt generated by the current mirror circuit of the transistors 68 and 72 flows from the drain of the transistor 72 toward the node N2, and is combined with the drain current output from the drain of the transistor 65 at the node N2. The drain current of the transistor 65 is a current (α×Icnt) having a magnitude obtained by amplifying the control current Icnt by α times. The drain current of the transistor 65 flows from the drain of the transistor 65 toward the node N2. The control current Iaoccnt is generated by combining the drain current of the transistor 65 and the control current Iagc2cnt, and flows from the node N2 toward the output terminal 51b.

On the other hand, when the current value of the control current Icnt is smaller than the current value of the offset current Iofs, no current flows to the transistor 68, so that the potential of the node N1 is pulled up with high resistance on the power supply voltage VCC side by the transistor 68 diode-connected. Since a drain-source voltage of the transistor 67 decreases, the transistors 66 and 67 do not operate as a current mirror circuit. At this time, since the transistor 67 operates in a triode region (linear region), the potential of the node N1 is pulled up with low resistance on the power supply voltage VCC side.

Since the gate-source voltage is not applied to the transistor 68, a resistance value of the transistor 67 to which the gate-source voltage is applied is smaller than a resistance value of the transistor 68. As described above, the transistor 67 operates in the triode region, so that the transistor 67 cannot supply the offset current Iofs, and at the same time, the control current Icnt from the transistor 63 entirely flows through the transistor 67. As a result, only when the current value of the control current Icnt is larger than the current value of the offset current Iofs (in the region of Icnt−Iofs>0), the control current Iagc1cnt is output from the output terminal 51c and the control current Iagc2cnt is output from the output terminal 51e and the drain of the transistor 72.

Thus, the control current Iagc1cnt and the control current Iagc2cnt have the same current amount and flow in the same direction. That is, the control currents Iagc1cnt and Iagc2cnt flow from the power supply voltage VCC toward the ground potential GND.

Although the input/output characteristic of FIG. 12 can be obtained by the control circuit 51C shown in FIG. 13, the above-described current mirror ratio may be appropriately changed. As the circuit configuration of the control circuit 51C, another circuit configuration capable of obtaining the input/output characteristic of FIG. 12 may be adopted.

Since the circuit configurations of the feedback current source 52 and the variable resistance circuit 53 in the bypass circuit 15C are the same as the circuit configurations of the feedback current source 52 and the variable resistance circuit 53 in the bypass circuit 15, description thereof will be omitted. As will be described later, the control current Iagc2cnt flows out from the variable resistance circuit 80 toward the input terminal of the TIA unit 11 to increase the DC component of the photocurrent Ipd. Thus, the DC bypass current Iaoc generated by the feedback current source 52 is set so as to include the control current Iagc2cnt. Specifically, as shown in FIG. 12, the control current Iaoccnt is generated by adding the control current Iagc2cnt to the current generated by amplifying the control current Icnt with the amplification factor α. As a result, the DC component and the control current Iagc2cnt are drawn as the DC bypass current Iaoc from the photocurrent Ipd. As a result, the DC component and the low frequency component are removed from the difference ΔVtia, and the potential of the voltage signal Vtia is aligned with the potential of the reference voltage signal Vref (DC offset control).

The variable resistance circuit 80 is a circuit that generates the AC bypass current Iagc2 based on the control current Icnt. More specifically, the variable resistance circuit 80 generates the AC bypass current Iagc2 in accordance with the control current Iagc2cnt. The variable resistance circuit 80 has a control terminal 80a, a resistance terminal 80b, and a resistance terminal 80c. The control terminal 80a is electrically connected to the output terminal 51e of the control circuit 51C and receives the control current Iagc2cnt from the control circuit 51C. The resistance terminal 80b is electrically connected to an output terminal of the reference voltage generation circuit 12 (voltage amplifier 12a) and receives the reference voltage signal Vref from the reference voltage generation circuit 12. The resistance terminal 80c is electrically connected to the input terminal 10a. The variable resistance circuit 80 includes a field effect transistor 81 (fifth field effect transistor) and a field effect transistor 82 (sixth field effect transistor).

Each of the field effect transistors 81 and 82 is, for example, an N-channel MOS transistor. The size of the field effect transistor 81 and the size of the field effect transistor 82 may be the same as or different from each other. Sources of the field effect transistors 81 and 82 are electrically connected to each other and also electrically connected to the input terminal 10a via the resistance terminal 80c. A drain of the field effect transistor 81 is electrically connected to the output terminal 51e of the control circuit 51C via the control terminal 80a and receives the control current Iagc2cnt from the control circuit 51C. A gate of the field effect transistor 81 is electrically connected to the drain of the field effect transistor 81. A gate of the field effect transistor 82 is electrically connected to the drain and gate of the field effect transistor 81. A drain of the field effect transistor 82 is electrically connected to the output terminal of the reference voltage generation circuit 12 (voltage amplifier 12a) via the resistance terminal 80b. The reference voltage signal Vref is input (supplied) to the drain of the field effect transistor 82. In other words, a relationship between a resistance terminal connected to the reference voltage generation circuit 12 and a resistance terminal connected to the input terminal 10a is opposite between the variable resistance circuit 53 and the variable resistance circuit 80.

In the variable resistance circuit 80 configured as above, the control current Iagc2cnt flowing from the control terminal 80a flows to the field effect transistor 81 diode-connected, so that a gate-source voltage Vgs3 is generated between the gate and source of the field effect transistor 81. The gate of the field effect transistor 81 and the gate of the field effect transistor 82 are electrically connected to each other, and the source of the field effect transistor 81 and the source of the field effect transistor 82 are electrically connected to each other. Therefore, the gate-source voltage of the field effect transistor 82 is equal to the gate-source voltage Vgs3. The reference voltage signal Vref is supplied to the drain of the field effect transistor 82, and the input potential of the TIA unit 11 is applied to the source of the field effect transistor 82. Since the reference voltage signal Vref has substantially the same potential as the input potential of the TIA unit 11, the field effect transistor 82 operates in a deep triode region (linear region). When the drain voltage of the field effect transistor 82 increases in the linear region, the drain current increases accordingly. Especially when the drain voltage is relatively small, the drain current can be considered to change (linearly) in proportion to the drain voltage. A ratio of the drain voltage to the drain current of the field effect transistor 82 will be expressed as a resistance value $R_{AGC2}$.

As a result, the field effect transistor 82 operates as a variable resistor controlled by the gate-source voltage Vgs3, similarly to the field effect transistor 57. The resistance value $R_{AGC2}$ of the field effect transistor 82 is represented by Formula (4), similarly to the resistance value $R_{AGC1}$. That is, the reference voltage generation circuit 12 grounds the field effect transistor 82 in an alternating current manner and the field effect transistor 82 is biased in the deep triode region. Since a potential of the resistance terminal 80b and a potential of the resistance terminal 80c are substantially the same, the DC component of the photocurrent Ipd hardly flows to the variable resistance circuit 80, and the AC component of the photocurrent Ipd partially flows as the AC bypass current Iagc2 into the variable resistance circuit 80 (field effect transistor 82). In other words, the variable resistance circuit 80 flows the AC bypass current Iagc2 between the drain and source of the field effect transistor 82 in accordance with the control current Iagc2cnt. Since the AC bypass current Iagc2 is an AC component, the AC bypass current Iagc2 may flow from the source of the field effect transistor 82 to the drain of the field effect transistor 82 according to the photocurrent Ipd or may flow from the drain of the field effect transistor 82 to the source of the field effect transistor 82 according to the photocurrent Ipd.

That is, the photocurrent Ipd increases, the difference ΔVtia increases, and when the control current Icnt exceeds the current value of the offset current Iofs, the control current Iagc2cnt is supplied to the variable resistance circuit 80. As a result, the gate-source voltage Vgs3 is generated in the field effect transistors 81 and 82. As the gate-source voltage Vgs3 increases, the resistance value $R_{AGC2}$ of the field effect transistor 82 decreases, so that the signal component (AC component) of the photocurrent Ipd excluding the DC component is partially drawn as the AC bypass current Iagc2. As a result, a possibility that the TIA unit 11 will be saturated by a large signal input is reduced.

The current proportional to the drain-source voltage flows between the drain and source of the field effect transistor 82 biased in the deep triode region (linear region). Since the reference voltage signal Vref has substantially the same potential as the input potential of the TIA unit 11, no DC current flows, and the AC bypass current Iagc2 does not disturb the DC offset control. The change in the resistance value $R_{AGC2}$ of the field effect transistor 82 affects only characteristics of an AOC control gain.

In the variable resistance circuit 80, the control current Iagc2cnt flowing from the control terminal 80a flows into the diode-connected field effect transistor 81, flows out from the resistance terminal 80c toward the input terminal of the TIA unit 11, and increases the DC component of the photocurrent Ipd. As described above, the control current Iagc2cnt is drawn as a portion of the DC bypass current Iaoc by the feedback current source 52. This suppresses occurrence of DC offset in the potential of the voltage signal Vtia due to the control current Iagc2cnt.

Next, a relationship between the variable resistance circuit 53 and the variable resistance circuit 80 will be described. At the input terminal of the TIA unit 11, a maximum amplitude of about 100 mV is generated by the current signal Iin. The drain-source voltages Vds of the field effect transistors 57 and 82 may vary with this potential variation. As described above, the drain of the field effect transistor 57 and the source of the field effect transistor 82 are commonly connected to the input terminal 10a (input terminal of the TIA unit 11), and the source of the field effect transistor 57 and the drain of the field effect transistor 82 are commonly connected to the output terminal of the reference voltage generation circuit 12 (voltage amplifier 12a). For this reason, the drain-source voltages Vds (variation thereof) in opposite directions from each other (having opposite polarities) are generated in the field effect transistor 57 and the field effect transistor 82 due to the above-described potential variation.

Since the variable resistance circuit 53 and the variable resistance circuit 80 are connected in parallel between the input terminal 10a and the output terminal of the reference voltage generation circuit 12, a combined resistance value $R_{AGCT}$ of the variable resistance circuit 53 and the variable resistance circuit 80 viewed from the input terminal 10a (input of the TIA unit 11), the resistance value $R_{AGC1}$, and the resistance value $R_{AGC2}$ satisfy the relationship of Formula (9). Here, the field effect transistor 57 and the field effect transistor 82 are transistors having the same structure, have the same size, and have the same electrical characteristics. That is, the intrinsic gain β, gate-source voltage Vgs0, and threshold voltage Vth of the field effect transistor 57 are respectively equal to the intrinsic gain β, gate-source voltage Vgs0, and threshold voltage Vth of the field effect transistor 82. In this case, although the resistance value $R_{AGC1}$ and the resistance value $R_{AGC2}$ are both represented by Formula (4), the drain-source voltages Vds having opposite polarities are generated in the field effect transistor 57 and the field effect transistor 82, so that the drain-source voltage Vds generated in the field effect transistor 57 is referred to as "+Vds", and the drain-source voltage Vds generated in the field effect transistor 82 is referred to as "−Vds".

[Formula 9]

$$\frac{1}{R_{AGCT}} = \frac{1}{R_{AGC1}} + \frac{1}{R_{AGC2}} = \beta \times (Vgs0 - Vth + Vds) + \beta \times (Vgs0 - Vth - Vds) = 2 \times \beta \times (Vgs0 - Vth) \quad (9)$$

Formula (10) is obtained by rearranging Formula (9). As shown in Formula (10), the combined resistance value $R_{AGCT}$ does not include the component of the drain-source voltage Vds, and therefore does not change with the drain-source voltage Vds. Therefore, the combined resistance value $R_{AGCT}$ does not depend on the drain-source voltage Vds, and does not vary from a resistance value when the drain-source voltage Vds is 0 V. As a result, the AC component is drawn from the photocurrent Ipd with low distortion.

[Formula 10]

$$R_{AGCT} = \frac{1}{2 \times \beta \times (Vgs0 - Vth)} \quad (10)$$

For example, when a potential of the input terminal 10a becomes larger than the reference voltage signal Vref by a voltage Δvds due to a potential variation at the input terminal of the TIA unit 11, the drain-source voltage Vds of the field effect transistor 57 is +Δvds, and the drain-source voltage Vds of the field effect transistor 82 is −Δvds. At this time, in the variable resistance circuit 53, a current Aids due to the voltage Δvds flows from the resistance terminal 53b toward the resistance terminal 53c. On the other hand, in the variable resistance circuit 80, the current Aids due to the voltage Δvds flows from the resistance terminal 80b toward the resistance terminal 80c. These currents Aids flow to the reference voltage generation circuit 12 in opposite directions from each other and are canceled. Thus, the reference voltage signal Vref of the reference voltage generation circuit 12 is substantially constant regardless of the photocurrent Ipd. As a result, the reference voltage signal Vref is stabilized, so that the influence of the drain-source voltage Vds on the combined resistance value $R_{AGCT}$ is further reduced. That is, the variable resistance circuit 53 and the variable resistance circuit 80 have a relationship that compensates for non-linearity. Thus, in the transimpedance amplifier circuit 10C, the current signal Iin can be amplified without being distorted.

Figure 14A:
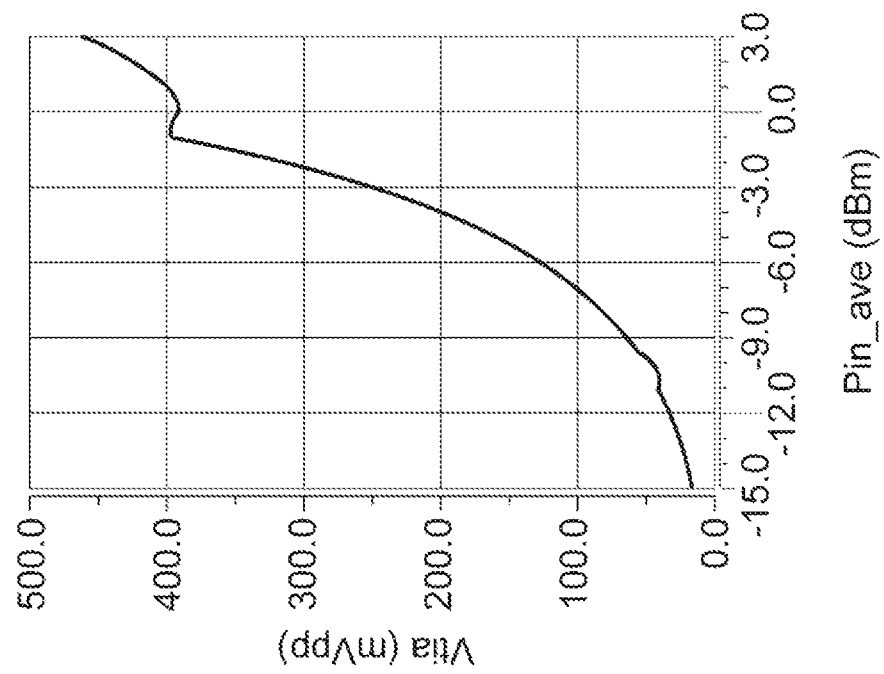
FIG. 14A is a diagram showing a change in total harmonic distortion with respect to the average input light power in the transimpedance amplifier circuit shown in FIG. 11.
Figure 14B:
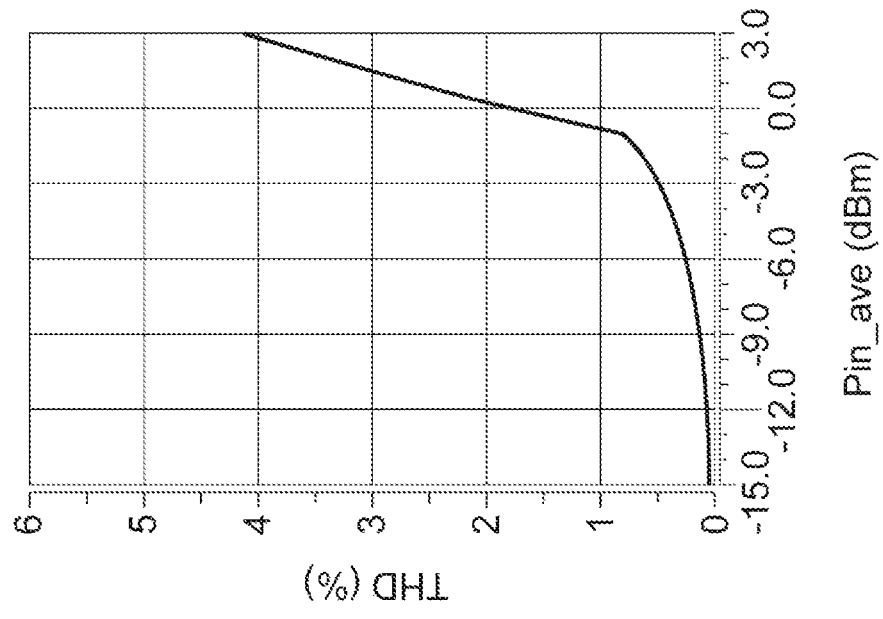
FIG. 14B is a diagram showing a change in output amplitude of a TIA unit with respect to the average input light power in the transimpedance amplifier circuit shown in FIG. 11.
Figure 15B:
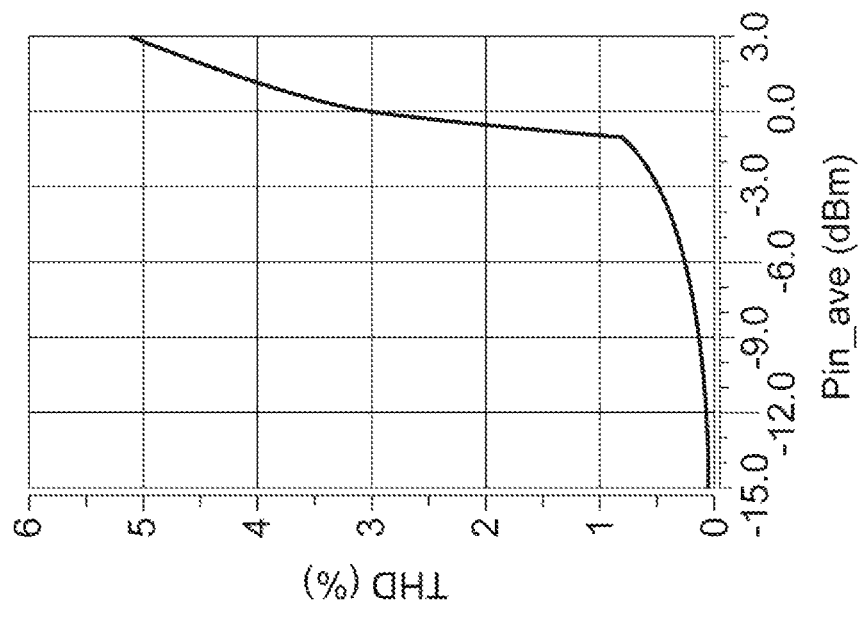
FIG. 15B is a diagram showing a change in output amplitude of a TIA unit with respect to the average input light power in the transimpedance amplifier circuit of the second comparative example.
Figure 15A:
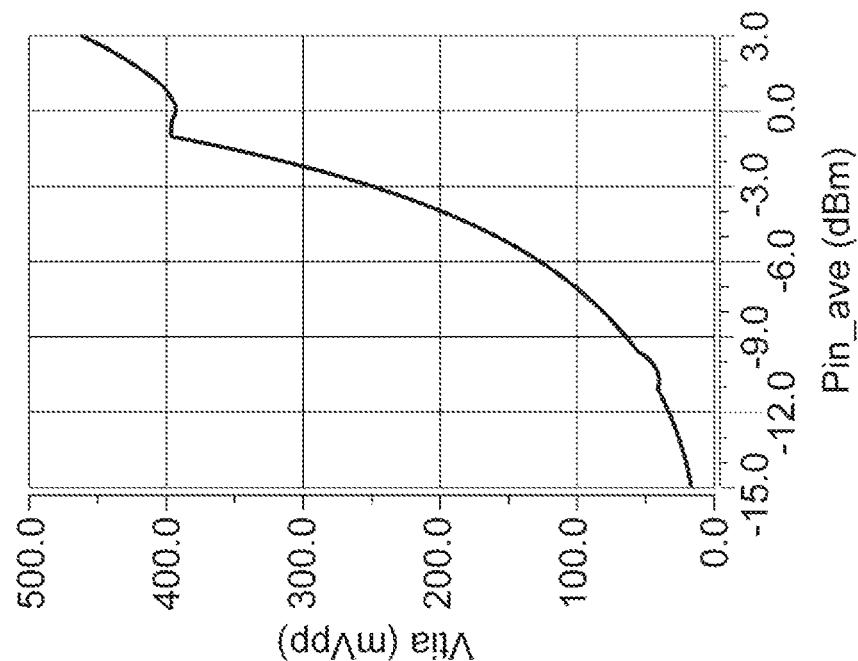
FIG. 15A is a diagram showing a change in total harmonic distortion with respect to the average input light power in a transimpedance amplifier circuit of a second comparative example.

Next, the function and effect of the transimpedance amplifier circuit 10C will be described. FIG. 14A is a diagram showing a change in total harmonic distortion with respect to the average input light power in the transimpedance amplifier circuit shown in FIG. 11. FIG. 14B is a diagram showing a change in output amplitude of a TIA unit with respect to the average input light power in the transimpedance amplifier circuit shown in FIG. 11. FIG. 15A is a diagram showing a change in total harmonic distortion with respect to an average input light power in a transimpedance amplifier circuit of a second comparative example. FIG. 15B is a diagram showing a change in output amplitude of a TIA unit with respect to the average input light power in the transimpedance amplifier circuit of the second comparative example.

The horizontal axes of FIGS. 14A, 14B, 15A, and 15B represent an average input light power Pin_ave (unit: dBm), that is an average value of an optical input power of an optical signal Pin. The vertical axes of FIGS. 14A and 15A represent the total harmonic distortion (THD) (unit: %) of an output waveform (waveform of the differential voltage signal Vout,Voutb). The vertical axes of FIGS. 14B and 15B represent an amplitude (unit: mVpp) of the voltage signal Vtia.

The calculation results shown in FIGS. 14A and 14B are the calculation results in the transimpedance amplifier circuit 10C (hereinafter, referred to as "second example"). The calculation results shown in FIGS. 15A and 15B are the calculation results in the transimpedance amplifier circuit of the second comparative example (hereinafter, referred to as "second comparative example"). The transimpedance amplifier circuit of the second comparative example mainly differs from the transimpedance amplifier circuit 10C in that the transimpedance amplifier circuit of the second comparative example does not include the variable resistance circuit 80, and the resistance value $R_{AGC1}$ of the field effect transistor 57 is set to half of that in the transimpedance amplifier circuit 10C. That is, the configuration of the transimpedance amplifier circuit of the second comparative example is the same as the configuration of the transimpedance amplifier circuit of the first comparative example.

The current value of the offset current Iofs is set so that the AGC operates when the average input light power Pin_ave exceeds around −1 dBm. As the total harmonic distortion, the total harmonic distortion considering up to the 10th harmonic is calculated. In order to prevent distortion from occurring in a differential amplifier circuit 13 provided at the next stage, the size of the field effect transistor 57 is determined so that the maximum amplitude of the voltage signal Vtia does not exceed 500 mVpp. A gain (voltage gain) of the TIA unit 11 is set to 10 times, and a resistance value of a feedback resistance element 11b is set to 550Ω. As the optical signal Pin, an optical signal obtained by intensity modulation with a 1 GHz sine wave is used, and the amplitude of the optical signal Pin is set to be the same as the average input light power Pin_ave (extinction ratio of about 5 dB). A photoelectric conversion gain of the photodetector PD is set to 1.0 A/W in order to simplify the calculation.

Comparing FIG. 14A and FIG. 15A, it can be seen that when the average input light power Pin_ave is 3 dBm, the THD is 5.2% in the second comparative example, whereas the THD is reduced to 4.1% in the second example. Comparing FIG. 14B and FIG. 15B, it can be seen that the amplitudes of the voltage signals Vtia are controlled to be equal to each other in the second comparative example and the second example. That is, it can be seen that although an amount of drawing of the AC bypass current Iagc1 in the second example is equivalent to that in the second comparative example, the THD of the second example is improved compared to the MD of the second comparative example.

In the second example, since the drain-source voltage Vds in the variable resistance circuit 53 and the drain-source voltage Vds in the variable resistance circuit 80 change complementarily, distortion of the resistance value $R_{AGC1}$ of the field effect transistor 57 is canceled by distortion of the resistance value $R_{AGC2}$ of the field effect transistor 82. That is, a connection destination of the drain and source of the field effect transistor 82 is inverted with respect to (replaced with) the connection destination of the drain and source of the variable resistance circuit 53, so that when the drain-source voltage Vds in the variable resistance circuit 53 is a positive value, the drain-source voltage Vds in the field effect transistor 82 is a negative value. Therefore, as shown in Formulae (9) and (10), the variable resistance circuits 53 and 80 operate such that the distortion of the resistance value $R_{AGC1}$ of the field effect transistor 57 and the distortion of the resistance value $R_{AGC2}$ of the field effect transistor 82 are cancelled mutually.

As described above, in the transimpedance amplifier circuit 10C, the bypass circuit 15C generates the DC bypass current Iaoc, the AC bypass current Iagc1, and the AC bypass current Iagc2, and the DC bypass current Iaoc, the AC bypass current Iagc1, and the AC bypass current Iagc2 are drawn from the photocurrent Ipd generated by the photodetector PD, so that the current signal Iin is generated. Then, the TIA unit 11 converts the current signal Iin into the voltage signal Vtia, and the differential amplifier circuit 13 generates the differential voltage signal Vout,Voutb in accordance with the difference ΔVtia between the voltage signal Vtia and the reference voltage signal Vref.

In the variable resistance circuit 53, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other, so that the gate-source voltage of the field effect transistor 57 is equal to the gate-source voltage Vgs2. The reference voltage signal Vref is supplied to the source of the field effect transistor 57, and the drain of the field effect transistor 57 is electrically connected to the input terminal 10a. Therefore, there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases.

Similarly, in the variable resistance circuit 80, the field effect transistor 81 is diode-connected, so that when the drain of the field effect transistor 81 receives the control current Iagc2cnt, the gate-source voltage Vgs3 is generated between the gate and source of the field effect transistor 81. The gate of the field effect transistor 81 and the gate of the field effect transistor 82 are electrically connected to each other, and the source of the field effect transistor 81 and the source of the field effect transistor 82 are electrically connected to each other. Therefore, the gate-source voltage of the field effect transistor 82 is equal to the gate-source voltage Vgs3. The reference voltage signal Vref is supplied to the drain of the field effect transistor 82, and the source of the field effect transistor 82 is electrically connected to the input terminal 10a. Therefore, there is almost no potential difference between the drain and source of the field effect transistor 82. As a result, the field effect transistor 82 operates in the (deep) triode region. Thus, the field effect transistor 82 functions as a variable resistor, and an output impedance of the source of the field effect transistor 82 decreases.

There is almost no potential difference between the drain and source of the field effect transistor 57, and there is almost no potential difference between the drain and source of the field effect transistor 82. Thus, although the DC component of the photocurrent Ipd hardly flows into the field effect transistors 57 and 82, the AC component of the photocurrent Ipd may flow as the AC bypass currents Iagc1 and Iagc2 into the field effect transistors 57 and 82. The control currents Iagc1cnt and Iagc2cnt are obtained by amplifying a difference (difference current) between a current generated by amplifying the control current Icnt and the offset current Iofs with the amplification factor γ. Therefore, when the control current Icnt exceeds the current value of the offset current Iofs, the control currents Iagc1cnt and Iagc2cnt increase as the control current Icnt increases, and the gate-source voltages Vgs2 and Vgs3 also increase. Thus, when the photocurrent Ipd has a small or medium signal intensity, the drawing of the AC bypass currents Iagc1 and Iagc2 are suppressed, so that the attenuation of the AC component of the photocurrent Ipd can be avoided. When the photocurrent Ipd has a large signal intensity, the AC component of the photocurrent Ipd is drawn as the AC bypass currents Iagc1 and Iagc2 from the photocurrent Ipd, so that the AC component of the photocurrent Ipd can be attenuated. Thus, the variable resistance circuits 53 and 80 control a gain of the transimpedance amplifier circuit 10C.

Since the resistance value $R_{AGC1}$ of the field effect transistor 57 and the resistance value $R_{AGC2}$ of the field effect transistor 82 of the variable resistance circuit 80 include the component of the drain-source voltage Vds, the resistance values $R_{AGC1}$ and $R_{AGC2}$ can be changed by the drain-source voltage Vds. In the field effect transistor 57, the reference voltage signal Vref is supplied to the source, and the drain is electrically connected to the input terminal 10a. On the other hand, in the field effect transistor 82, the reference voltage signal Vref is supplied to the drain, and the source is electrically connected to the input terminal 10a. Thus, the polarity of the drain-source voltage Vds of the field effect transistor 57 and the polarity of the drain-source voltage Vds of the field effect transistor 82 are opposite to each other.

Therefore, in the combined resistance value $R_{AGCT}$ of the variable resistance circuit 53 and the variable resistance circuit 80 viewed from the input terminal 10a, the component of the drain-source voltage Vds of the field effect transistor 57 and the component of the drain-source voltage Vds of the field effect transistor 82 are cancelled out each other. As a result, the variation of the combined resistance value $R_{AGCT}$ due to the drain-source voltage Vds of the field effect transistor 57 and the drain-source voltage Vds of the field effect transistor 82 is suppressed. As a result, since occurrence of distortion is suppressed, a signal quality can be improved.

The gain of the transimpedance amplifier circuit 10C changes depending on a combined output impedance of an output impedance of the resistance terminal 53b and an output impedance of the resistance terminal 80c. The combined output impedance may be determined in consideration of the input impedance Zin of the TIA unit 11, similarly to the output impedance of the resistance terminal 53b of the variable resistance circuits 53 and 53B. For example, when a variable gain ratio of the TIA unit 11 is A (A is a real number larger than 1), the combined output impedance is set to Zin/(A-1). Thus, when the value of the current signal Iin of the TIA unit 11 when the AGC is not performed is Iinoff, a value Iinon of the current signal Iin when the AGC is performed is Iinon=Iinoff/A. For example, when A=2, the combined output impedance is substantially equal to Zin, and when A is larger than 2, the combined output impedance is a value smaller than Zin. Therefore, when the AOC and the AGC are performed simultaneously, the output impedance of the output terminal 52b is set to be larger than the combined output impedance. When the AGC is not performed, the combined output impedance may be set to 100×Zin or more. The combined output impedance may be considered to be equal to the combined resistance value $R_{AGCT}$ described above. Since the input impedance Zin and the combined output impedance may have different frequency characteristics from each other, it is sufficient that the above-described relationship is satisfied at least in a predetermined frequency range (band).

The bypass circuit 15C includes the feedback current source 52 that generates the DC bypass current Iaoc based on the control current Icnt, the variable resistance circuit 53C that generates the AC bypass current Iagc1 based on the control current Icnt, and the variable resistance circuit 80 that generates the AC bypass current Iagc2 based on the control current Icnt. The control circuit 51C controls the feedback current source 52 so that the DC bypass current Iaoc increases as the control current Icnt increases, and controls the variable resistance circuits 53 and 80 so that the AC bypass currents Iagc1 and Iagc2 increase as the control current Icnt increases when the control current Icnt exceeds the current value of the offset current Iofs. According to this configuration, it is possible to realize the control (DC offset control) for removing the DC component and the gain control for the transimpedance amplifier circuit 10C with a single control loop, so that the increase of the circuit scale can be suppressed.

In the feedback current source 52, the field effect transistor 54 is diode-connected, so that when the drain of the field effect transistor 54 receives the control current Iaoccnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance of the TIA unit 11. For example, when the input impedance of the TIA unit 11 is Zin, the output impedance of the output terminal 52b may be set to 100×Zin or more. Since the input impedance Zin and the output impedance of the output terminal 52b may have different frequency characteristics from each other, it is sufficient that such a relationship is satisfied at least in a predetermined frequency range (band).

In the variable resistance circuit 80, the control current Iagc2cnt flows from the drain to the source of the field effect transistor 81. Since the source of the field effect transistor 81 is electrically connected to the input terminal 10a, the control current Iagc2cnt flows out to the input terminal 10a (input terminal of the TIA unit 11) and increases the DC component of the photocurrent Ipd. On the other hand, since the DC bypass current Iaoc is set to include the control current Iagc2cnt, the DC component caused by the control current Iagc2cnt can be removed from the photocurrent Ipd. As a result, occurrence of DC offset in the potential of the voltage signal Vtia due to the control current Iagc2cnt can be suppressed.

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuits 53 and 80 viewed from the input terminal of the TIA unit 11 is low in a wide frequency range. Thus, the AC bypass currents Iagc1 and Iagc2 can be easily drawn from the photocurrent Ipd.

Since the DC offset control is performed using the high-impedance feedback current source 52, the AC component of the photocurrent Ipd is less affected (the AC component does not flow to the feedback current source 52). On the other hand, the gain control is performed by bypassing the AC component of the photocurrent Ipd using the variable resistance circuits 53 and 80, and the drain potential and the source potential of the field effect transistors 57 and 82 are substantially equal to each other. Therefore, the DC component of the photocurrent Ipd is less affected (no DC component flows to the variable resistance circuits 53 and 80). As a result, interference between the control of the removal of the DC component and the gain control can be avoided.

As described above, according to the transimpedance amplifier circuit 10C, the gain control of the transimpedance amplifier circuit 10C and the DC offset control for setting the difference ΔVtia to 0 can be performed by a single control loop without interfering with each other, and the gain control can be performed with low distortion.

The transimpedance amplifier circuit according to the present disclosure is not limited to the above embodiments.

The circuit configurations of the TIA unit 11, the reference voltage generation circuit 12, the differential amplifier circuit 13, the control current circuit 14, and the bypass circuits 15, 15B, and 15C are not limited to the configurations shown in the above embodiments. For example, the TIA unit 11 is only required to be configured to convert the current signal Iin into the voltage signal Vtia. The reference voltage generation circuit 12 is only required to be configured to be able to supply the reference voltage signal Vref. The control current circuit 14 is only required to be configured to be able to generate the control current Icnt based on the integrated value of the difference ΔVtia.

The circuit configuration of the control circuit 51 is not limited to the circuit configuration shown in FIG. 4, and is only required to be configured to be able to generate the control current Iaoccnt and the control current Iagc1cnt shown in FIG. 3. The circuit configuration of the control circuit 51C is not limited to the circuit configuration shown in FIG. 13, and is only required to be configured to be able to generate the control current Iaoccnt, the control current Iagc1cnt, and the control current Iagc2cnt shown in FIG. 12.

The feedback current source 52 is only required to be configured to be able to generate the DC bypass current Iaoc so that the DC bypass current Iaoc increases as the control current Iaoccnt increases. Instead of the diode-connected field effect transistor 54, the feedback current source 52 may include, for example, a resistance element (resistor) provided so as to change the gate-source voltage of the field effect transistor 55 depending on the control current Iaoccnt. The source of the field effect transistor 55 does not have to be electrically connected to the ground potential GND, and it is sufficient that the source potential of the field effect transistor 55 is set so that the field effect transistor 55 operates in the saturation region. That is, the source potential of the field effect transistor 55 is set so that the drain potential of the field effect transistor 55 is higher than the source potential of the field effect transistor 55.

The variable resistance circuit 53 is only required to be configured to be able to generate the AC bypass current Iagc1 so that the AC bypass current Iagc1 increases as the control current Iagc1cnt increases. The variable resistance circuit 53 may include, instead of the diode-connected field effect transistor 56, a resistance element (resistor) provided so as to change the gate-source voltage of the field effect transistor 57 depending on the control current Iagc1cnt. The source of the field effect transistor 57 does not have to be electrically connected to the output terminal of the reference voltage generation circuit 12, and it is sufficient that the source potential of the field effect transistor 57 is set so that the field effect transistor 57 operates in the triode region. That is, the source potential of the field effect transistor 57 is set so that the drain potential of the field effect transistor 57 and the source potential of the field effect transistor 57 are substantially equal to each other.

The transimpedance amplifier circuits 10, 10B, and 10C may not include the reference voltage generation circuit 12, and the reference voltage signal Vref may be supplied from an external reference voltage generation circuit to the transimpedance amplifier circuits 10, 10B, and 10C.

In the above embodiments, the magnitude of the control current Iaoccnt (DC bypass current Iaoc) is adjusted by the amplification factor α; however, instead of this, the magnitude of the control current Iaoccnt may be adjusted by the current mirror ratio of the transistors 61 and 62 or both the amplification factor α and the current mirror ratio of the transistors 61 and 62. Similarly, the magnitude of the DC bypass current Iaoc may be adjusted by the current mirror ratio of the field effect transistors 54 and 55.

In the above embodiments, the magnitude of the control current Iagc1cnt (AC bypass current Iagc1) is adjusted by the amplification factor γ and the current values of the offset current Iofs; however, instead of the amplification factor γ, the magnitude of the control current Iagc1cnt may be adjusted by the current mirror ratio of the transistors 61 and 63 or the amplification factor γ, the current mirror ratio of the transistors 61 and 63, and the current value of the offset current Iofs. Similarly, the magnitude of the AC bypass current Iagc1 may be adjusted by the size of the field effect transistor 56, the size of the field effect transistor 57, and the like.

In the above embodiments, as the field effect transistors 54 and 55 and the transistors 61 to 69, 71, and 72, the field effect transistors have been used and described; however, the field effect transistors 54 and 55 and the transistors 61 to 69, 71, and 72 may be bipolar transistors. When the field effect transistors 54 and 55 and the transistors 61 to 69, 71, and 72 are bipolar transistors, the gate, source, and drain of the field effect transistor are replaceable by a base, an emitter, and a collector, respectively.

The bypass circuit 15 may not control the feedback current source 52 and the variable resistance circuit 53 with a single control loop. The bypass circuit 15B may not control the feedback current source 52 and the variable resistance circuit 53B with a single control loop. The bypass circuit 15C may not control the feedback current source 52, the variable resistance circuit 53, and the variable resistance circuit 80 with a single control loop.

Since the influence of the potential of the substrate terminal of the field effect transistor 57 on the gate potential is not so large, the variable resistance circuit 53B may not include the resistance element 59 (that is, resistance value Rb=0), and the field effect transistor 57 does not have to be configured such that the capacitance Cdb and the capacitance Csb are equal to each other. Even in this case, the variation of the differential resistance value (resistance value $R_{AGC1}$) of the field effect transistor 57 due to the drain-source voltage Vds is suppressed. As a result, since occurrence of distortion is suppressed, a signal quality can be improved.

Generally, an input impedance of a dummy TIA is about 10 to 100Ω similarly to the input impedance of the TIA unit 11, and an output impedance of the dummy TIA is about several Ω. Since both the input terminal and the output terminal of the dummy TIA generate the reference voltage signals Vref having substantially the same potential, either terminal may be used as the output terminal of the reference voltage generation circuit 12. Since the output impedance of the dummy TIA is lower than the input impedance, the resistance value $R_{AGC1}$ and resistance value $R_{AGC2}$ can be increased by using the output terminal of the dummy TIA as the output terminal of the reference voltage generation circuit 12, and the sizes of the field effect transistors 57 and 82 can be reduced. In other words, since parasitic capacitances of the field effect transistors 57 and 82 can be reduced, high frequency characteristics of the transimpedance amplifier circuit 10C can be improved.

In the transimpedance amplifier circuit 10C, the field effect transistor 57 and the field effect transistor 82 are transistors having the same structure, have the same size, and have the same electrical characteristics. However, the electrical characteristics of the field effect transistor 57 do not have to match the electrical characteristics of the field effect transistor 82. Even in this case, the variable resistance circuits 53 and 80 can reduce the influence of the drain-source voltage Vds, and can compensate the non-linearity of the combined resistance value $R_{AGCT}$.

What is claimed is:

1. A transimpedance amplifier circuit configured to generate a differential voltage signal in accordance with an input current signal generated by a photodetector, the transimpedance amplifier circuit comprising:
   an input terminal configured to receive the input current signal;
   a single-input amplifier configured to convert a current signal into a voltage signal;
   a differential amplifier circuit configured to generate the differential voltage signal based on the voltage signal and a reference voltage signal;
   a control current circuit configured to generate a control current based on the voltage signal and the reference voltage signal; and
   a bypass circuit configured to generate a direct current (DC) bypass current and an alternating current (AC) bypass current based on the control current, the bypass circuit being electrically connected to the input terminal, wherein
   the bypass circuit includes a control circuit configured to receive the control current, a feedback current source configured to generate the DC bypass current, and a variable resistance circuit configured to generate the AC bypass current, and
   the control circuit includes a first current mirror circuit and a second current mirror circuit, the first current mirror circuit varies the DC bypass current by controlling the feedback current source in accordance with the control current, and the second current mirror circuit varies the AC bypass current by controlling the variable resistance circuit in accordance with the control current and an offset current.

2. The transimpedance amplifier circuit according to claim 1, wherein
   the control circuit generates a first control current by amplifying the control current with a first amplification factor,
   the feedback current source includes
      a first field effect transistor having a first drain configured to receive the first control current, a first gate electrically connected to the first drain, and a first source electrically connected to a ground potential, and
      a second field effect transistor having a second drain electrically connected to the input terminal, a second gate electrically connected to the first drain and the first gate, and a second source electrically connected to the first source, and
   the feedback current source causes the DC bypass current to flow from the second drain to the second source in accordance with the first control current.

3. The transimpedance amplifier circuit according to claim 1, wherein
   the control circuit generates an offset current set to an offset current value and generates a second control current by amplifying a difference current between a current generated by amplifying the control current and the offset current with a second amplification factor,
   the variable resistance circuit includes
      a third field effect transistor having a third drain configured to receive the second control current, a third gate electrically connected to the third drain, and a third source to which the reference voltage signal is supplied, and
      a fourth field effect transistor having a fourth drain electrically connected to the input terminal, a fourth gate electrically connected to the third drain and the third gate, and a fourth source electrically connected to the third source, and
   the variable resistance circuit draws the AC bypass current from the input current signal in accordance with the second control current.

4. The transimpedance amplifier circuit according to claim 3, wherein
   the variable resistance circuit further includes a first resistor,
   the third field effect transistor further has a first substrate terminal to which the reference voltage signal is supplied,
   the fourth field effect transistor further has a second substrate terminal to which the reference voltage signal is supplied,
   the fourth gate is electrically connected to the third drain and the third gate via the first resistor,
   in the fourth field effect transistor, a first capacitance between the fourth gate and the fourth drain and a second capacitance between the fourth gate and the fourth source are equal to each other, and
   a resistance value of the first resistor is larger than an impedance due to the first capacitance.

5. The transimpedance amplifier circuit according to claim 4, wherein
   the variable resistance circuit further includes a second resistor,
   the reference voltage signal is supplied to the second substrate terminal via the second resistor,
   in the fourth field effect transistor, a third capacitance between the second substrate terminal and the fourth drain and a fourth capacitance between the second substrate terminal and the fourth source are equal to each other, and
   a resistance value of the second resistor is larger than an impedance due to the third capacitance.

6. The transimpedance amplifier circuit according to claim 3, wherein
   the bypass circuit further draws another AC bypass current in accordance with a third control current,
   the bypass circuit further includes another variable resistance circuit configured to generate the another AC bypass current based on the control current,
   the control circuit generates the third control current by amplifying the difference current with the second amplification factor, and
   the another variable resistance circuit includes
      a fifth field effect transistor having a fifth drain configured to receive the third control current, a fifth gate electrically connected to the fifth drain, and a fifth source electrically connected to the input terminal, and a sixth field effect transistor having a sixth drain to which the reference voltage signal is supplied, a sixth gate electrically connected to the fifth drain and the fifth gate, and a sixth source electrically connected to the fifth source.

7. The transimpedance amplifier circuit according to claim 6, wherein the DC bypass current is set so as to include the third control current flowing out from the another variable resistance circuit.

8. The transimpedance amplifier circuit according to claim 1, further comprising
a reference voltage generation circuit configured to generate the reference voltage signal,
wherein the reference voltage generation circuit includes an amplifier and a feedback resistor electrically connected between an input and an output of the amplifier.

9. A transimpedance amplifier circuit configured to generate a differential voltage signal in accordance with an input current signal generated by a photodetector, the transimpedance amplifier circuit comprising:
an input terminal configured to receive the input current signal;
a single-input amplifier having an input node, the single-input amplifier being configured to receive a current signal via the input node and convert a current signal into a voltage signal, the input node being electrically connected to the input terminal;
a differential amplifier circuit having a first input and a second input, the differential amplifier circuit being configured to receive the voltage signal via the first input and a reference voltage via the second input, and generate the differential voltage signal;
a control current circuit having a third input and a fourth input, the control current circuit being configured to receive the voltage signal via the third input and the reference voltage via the fourth input, and generate a control current; and
a bypass circuit configured to generate a direct current (DC) bypass current and an alternating current (AC) bypass current based on the control current, the bypass circuit being electrically connected to the input terminal, wherein
the bypass circuit includes a control circuit, a feedback current source, and a variable resistance circuit,
the control circuit generates a first control current and a second control current,
the feedback current source has a first terminal electrically connected to the input terminal and the input node of the single-input amplifier and a second terminal electrically connected to a ground line, and generates the DC bypass current flowing from the first terminal to the second terminal in accordance with the first control current,
the variable resistance circuit has a third terminal electrically connected to the input terminal and the input node of the single-input amplifier and a fourth terminal receiving the reference voltage, and draws the AC bypass current from the input current signal by varying a resistance between the third terminal and the fourth terminal in accordance with the second control current, and
the control circuit includes a first current mirror circuit and a second current mirror circuit, the first current mirror circuit generates the first control current in accordance with the control current, the second current mirror circuit generates the second control current in accordance with the control current.

* * * * *